(12) United States Patent
Yamazaki et al.

(10) Patent No.: US 6,770,518 B2
(45) Date of Patent: Aug. 3, 2004

(54) METHOD FOR MANUFACTURING A SEMICONDUCTOR DEVICE

(75) Inventors: Shunpei Yamazaki, Tokyo (JP); Hideto Ohnuma, Kanagawa (JP); Tamae Takano, Kanagawa (JP); Toru Mitsuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/056,054

(22) Filed: Jan. 28, 2002

(65) Prior Publication Data

US 2002/0119585 A1 Aug. 29, 2002

(30) Foreign Application Priority Data

Jan. 29, 2001 (JP) ........................................ 2001-019331

(51) Int. Cl.[7] .............................................. H01L 21/84
(52) U.S. Cl. ............................................................ 438/166
(58) Field of Search ................................. 438/166, 151, 438/482, 486, 487, 662, 764

(56) References Cited

U.S. PATENT DOCUMENTS

| | | | |
|---|---|---|---|
| 4,256,681 A | | 3/1981 | Lindmayer |
| 4,814,292 A | | 3/1989 | Sasaki et al. |
| 5,529,937 A | * | 6/1996 | Zhang et al. ................ 438/471 |
| 5,569,610 A | | 10/1996 | Zhang et al. |
| 5,639,698 A | | 6/1997 | Yamazaki et al. |
| 5,643,826 A | | 7/1997 | Ohtani et al. |
| 5,663,077 A | | 9/1997 | Adachi et al. |
| 5,773,327 A | | 6/1998 | Yamazaki et al. |
| 5,824,573 A | | 10/1998 | Zhang et al. |
| 5,854,096 A | | 12/1998 | Ohtani et al. |
| 5,879,977 A | | 3/1999 | Zhang et al. |
| 5,904,770 A | * | 5/1999 | Ohtani et al. ................ 117/103 |
| 5,923,962 A | | 7/1999 | Ohtani et al. |
| 5,923,997 A | | 7/1999 | Mitanaga et al. |
| 5,948,496 A | | 9/1999 | Kinoshita et al. |
| 5,953,597 A | | 9/1999 | Kusumoto et al. |
| 6,014,944 A | | 1/2000 | Aklufi et al. |

(List continued on next page.)

FOREIGN PATENT DOCUMENTS

| | | |
|---|---|---|
| EP | 0 651 431 | 5/1995 |
| JP | 07-183540 | 7/1995 |
| JP | 11-74536 | 3/1999 |

OTHER PUBLICATIONS

Specification, Drawings, Abstract and Claims of Application Ser. No. 10/078,240 filed Feb. 20, 2002 entitled Method of Manufacturing a Semiconductor Device.

Specification, Drawings, Abstract and Claims of Application Ser. No. 10/081,767 filed Feb. 25, 2002, entitled Method of Manufacturing a Semiconductor Device.

(List continued on next page.)

*Primary Examiner*—Craig A. Thompson
(74) *Attorney, Agent, or Firm*—Eric J. Robinson; Robinson Intellectual Property Law Office, P.C.

(57) ABSTRACT

The crystallization method by laser light irradiation forms a multiplicity of convexes (ridges) in the surface of an obtained crystalline semiconductor film, deteriorating film quality. Therefore, it is a problem to provide a method for forming a ridge-reduced semiconductor film and a semiconductor device using such a semiconductor film. The present invention is characterized by heating a semiconductor film due to a heat processing method (RTA method: Rapid Thermal Anneal method) to irradiate light emitted from a lamp light source after crystallizing the semiconductor film by laser light, thereby reducing the ridge.

20 Claims, 17 Drawing Sheets

U.S. PATENT DOCUMENTS

| | | |
|---|---|---|
| 6,184,068 B1 | 2/2001 | Ohtani et al. |
| 6,281,057 B2 | 8/2001 | Aya et al. |
| 6,285,042 B1 | 9/2001 | Ohtani et al. |
| 6,319,761 B1 | 11/2001 | Zhang et al. |
| 6,326,248 B1 | 12/2001 | Ohtani et al. |
| 6,335,541 B1 | 1/2002 | Ohtani et al. |
| 6,509,579 B2 | 1/2003 | Takeya et al. |
| 2001/0003659 A1 | 6/2001 | Aya et al. |
| 2002/0127827 A1 | 9/2002 | Yamazaki et al. |

OTHER PUBLICATIONS

Abe et al., "High–Performance Poly–Crystalline Silicon TFTs Fabricated Using the SPC and ELA Methods", AM–LCD 98 Digest of Technical Papers, pp. 85–88.

Kimura et al., "Device Simulation of Interface Roughness in Laser–crystallized p–Si TFTs", AM–LCD 1999, pp. 263–266.

* cited by examiner

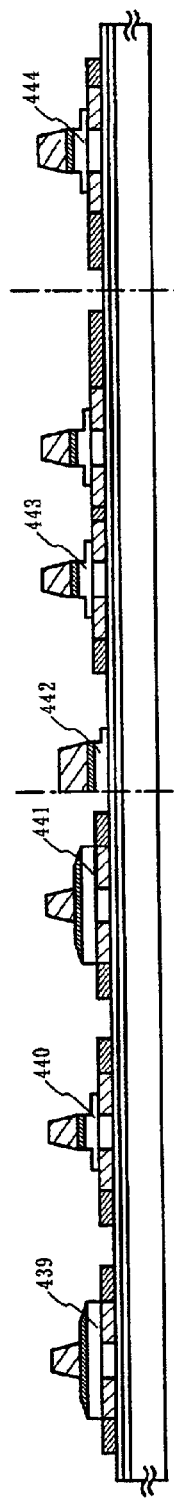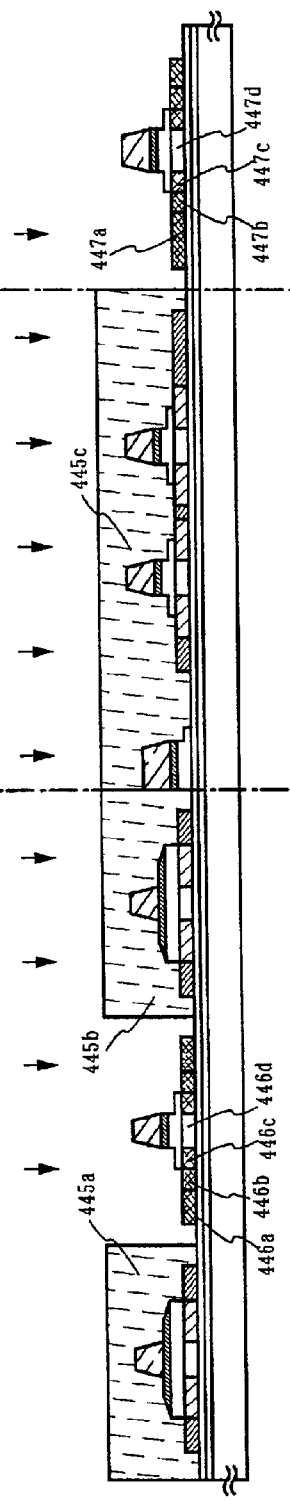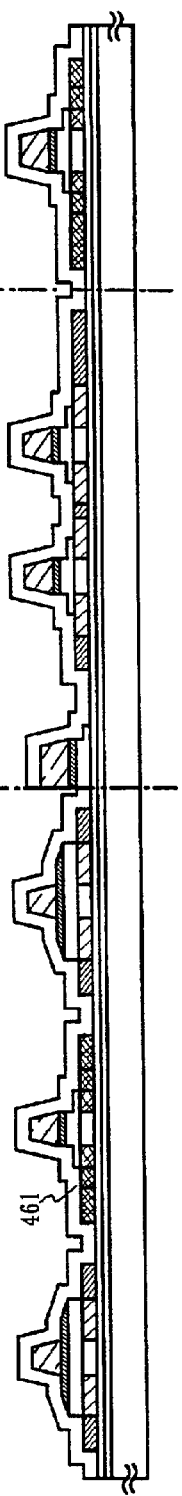
Fig. 6A
Fig. 6B
Fig. 6C

METHOD FOR MANUFACTURING A SEMICONDUCTOR DEVICE

BACKGROUND OF THE INVENTION

1. Technical Field of the Invention

The present invention relates to a semiconductor device manufactured by a process to anneal a semiconductor film by the use of a laser beam (hereinafter, referred to as laser anneal), and to a method for manufacturing the same. Incidentally, the semiconductor device referred herein includes an electrooptical device, such as a liquid crystal display device and light-emitting device, and an electronic apparatus including such an electrooptical device as a part.

2. Description of the Related Art

In recent years, study has been broadly made on the art to carry out laser anneal on a semiconductor film formed over an insulating substrate of glass or the like in order for crystallization or improving crystallinity. Such semiconductor films often use silicon. In the present description, the means for crystallizing a semiconductor film by using a laser beam and obtaining a crystalline semiconductor film is referred to as laser crystallization. Incidentally, in the description, the crystalline semiconductor film refers to a semiconductor film a crystallized region exists, including a semiconductor film crystallized all over the surface.

The glass substrate is cheap in price and excellent in workability as compared to the conventionally often used synthetic quartz glass substrate, having a merit to easily prepare a large-area substrate. This is the reason of the studies noted above. Meanwhile, the laser is used, by preference, in crystallization because the glass substrate is low in melting point. The laser can deliver high energy only to the semiconductor film without substantially increasing in substrate temperature. Furthermore, throughput is by far high as compared to the heating means using an electric furnace.

Because the crystalline semiconductor film formed through laser anneal has high mobility, thin film transistors (TFTs) can be formed using the crystalline semiconductor film. They are broadly utilized, e.g. in a monolithic liquid-crystal electrooptical device having pixel-driving and drive-circuit TFTs formed on one glass substrate.

Meanwhile, there is preferential use of a method for laser anneal that the high-output pulse laser light, of an excimer laser or the like, is formed through an optical system into a square spot in several-centimeter square or a linear form having a length of 10 centimeters or longer on an irradiation plane in order to scan the laser light (or moving a laser-light irradiation position relatively to the irradiated plane), because of high producibility and industrial superiority.

Particularly, the use of a linear beam can realize laser irradiation over the entire irradiation surface by scanning only in the direction perpendicular to a lengthwise direction of the linear beam, differently from the case using the laser light in a spot form requiring scanning back-and-forth and left-and-right, providing high production efficiency. The scanning in a direction rectangular to the lengthwise direction is carried out because the direction of scanning is the highest in efficiency. Due to the high production efficiency, the use of a linear beam formed of pulse-oscillated excimer laser light through a proper optical system in the current laser anneal process is in the mainstream of the technology to manufacture liquid crystal display devices using TFTs.

However, the crystallization process by laser light irradiation causes to form a multiplicity of convexes (ridges) in the surface of an obtained crystalline semiconductor film, lowering film quality. Namely, when laser light is irradiated to a semiconductor film, the semiconductor film instantaneously melted to cause local expansion. The internal stress caused by the expansion is relaxed to thereby form ridges in the surface of the crystalline semiconductor film. The height difference of ridges is nearly 0.5 to 2 times the film thickness.

In the insulated-gate semiconductor device, the ridges in the crystalline semiconductor film surface have a potential barrier or trap level formed due to dangling bond or lattice deformation, increasing the interface level between the active layer and the gate dielectric film. Meanwhile, the ridge at its summit is sharp and readily causes electric field concentration to possibly act as a source of current leak, eventually causing dielectric breakdown and short circuit. In addition, the ridges in the crystalline semiconductor film surface hinder the coverage of a gate dielectric film deposited by a sputter or CVD process, reducing reliability, e.g. poor insulation. Meanwhile, the factor determining electric-field effect mobility of a TFT includes a surface-scattering effect. The planarity in the interface of an active layer and a gate dielectric film of the TFT has a great effect upon the electric-field effect mobility. As the interface is greater in planarity, the higher electric-field effect mobility is available without undergoing the affection of scattering. In this manner, the ridges in the crystalline semiconductor film surface give effects upon every TFT characteristic, changing even the yield.

It is an object of the present invention to provide a method for forming a semiconductor film having a surface which is reduced in ridge and manufacturing a semiconductor device using such a semiconductor.

SUMMARY OF THE INVENTION

The present invention is characterized by heating a semiconductor film due to a heat processing method (RTA method: Rapid Thermal Anneal method) to irradiate the light emitted from a lamp light source after crystallizing the semiconductor film by laser light, thereby reducing the ridge.

An invention of a method for manufacturing a semiconductor device disclosed in the description comprises the steps of:

performing a heating process on a first semiconductor film to form a second semiconductor film;

irradiating laser light to the second semiconductor film to form a third semiconductor film having a plurality of convexes; and irradiating intense light to the third semiconductor film to form a fourth semiconductor film.

Meanwhile, another invention comprises the steps of:

irradiating intense light to a first semiconductor film to form a second semiconductor film;

irradiating laser light to the second semiconductor film to form a third semiconductor film having a plurality of convexes; and irradiating intense light to the third semiconductor film to form a fourth semiconductor film.

In the above, the intense light is preferably irradiated from above the substrate, from below the substrate or from above and below the substrate.

Preferably, the intense light is infrared light, visible light or ultraviolet light.

Preferably, the intense light is light emitted from a halogen lamp, a metal halide lamp, a xenon arc lamp, carbon arc lamp, high-pressure sodium lamp or high-pressure mercury lamp.

Preferably, an atmosphere within a process chamber when irradiating the intense light is a reducing gas.

Meanwhile, in the above, the substrate for forming a first semiconductor film can be a glass substrate, a quartz substrate, a metal substrate, a flexible substrate or the like. The glass substrate includes a substrate of glass such as barium boro-silicate glass and aluminum boro-silicate glass. Meanwhile, the flexible substrate refers to a film-formed substrate formed of PET, PES, PEN, acryl or the like. The manufacture of a semiconductor device is expected for weight reduction. It is desired to form a single layer or a multi-layer of barrier layers of aluminum (AlON, AlN, AlO or the like), carbon (DLC (Diamond-Like Carbon) or the like), SiN or the like on a surface or both surfaces of a flexible substrate, because durability or the like is improved.

Meanwhile, the present invention is characterized by performing a thermal crystallization method on a semiconductor film using a metal element to accelerate crystallization, and heating the semiconductor film by the RTA method after laser crystallization, thereby reducing the ridge. Particularly, the ridge is conspicuously reduced by carrying out the thermal crystallization method utilizing the RTA method and further laser crystallization and thereafter heating the semiconductor film again by the RTA method. In the thermal crystallization method using a metal element, the long-time heating process with thermal anneal using a furnace anneal furnace segregates the metal element to the grain boundary, providing energetically stable state. However, if the heating time is excessively short as in the RTA method, the heating process ends before segregating the metal element to the grain boundary, making the state energetically unstable. For this reason, it can be considered that a heating process to be carried out again readily causes atom rearrangement to easily reduce the ridge.

A invention of a method for manufacturing a semiconductor device disclosed in the description comprises the steps of:

introducing a metal element to a first semiconductor film;

performing a heating process on a first semiconductor film to form a second semiconductor film;

irradiating laser light to the second semiconductor film to form a third semiconductor film having a plurality of convexes; and irradiating intense light to the third semiconductor film to form a fourth semiconductor film.

Meanwhile, another invention comprises the steps of:

introducing a metal element to a first semiconductor film;

irradiating intense light to the first semiconductor film to form a second semiconductor film;

irradiating laser light to the second semiconductor film to form a third semiconductor film having a plurality of convexes; and irradiating intense light to the third semiconductor film to form a fourth semiconductor film.

In the above, the metal element is preferably one or a plurality of elements selected from Fe, Co, Ni, Ru, Rh, Pd, Os, Ir, Pt, Cu, Ag, Au, Sn and Sb.

Preferably, the intense light is irradiated from above the substrate, from below the substrate or from above and below the substrate.

Preferably, the intense light is infrared light, visible light or ultraviolet light.

Preferably, the intense light is light emitted from a halogen lamp, a metal halide lamp, a xenon arc lamp, carbon arc lamp, high-pressure sodium lamp or high-pressure mercury lamp.

Preferably, an atmosphere within a process chamber when irradiating the intense light is a reducing gas.

In the invention, after laser-light crystallization of a semiconductor film, the semiconductor film is heated by a thermal processing method (RTA method: Rapid Thermal Anneal method) to irradiate the light emitted from a lamp light source, thereby reducing the ridge and obtaining a semiconductor film improved in film quality. The TFTs manufactured using such a semiconductor film improve its electric characteristic. Furthermore, The semiconductor device manufactured using the TFTs makes it possible to improve operation characteristics and reliability.

BRIEF DESCRIPTION OF THE DRAWINGS

FIGS. 6A to 6C are sectional views showing a manufacturing process example of a pixel TFT and drive-circuit TFT;

DETAILED DESCRIPTION OF THE PREFERRED EMBODIMENTS

Figure 1A:
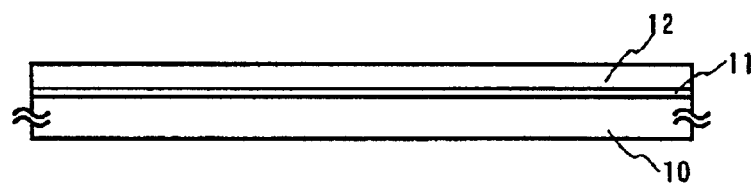
FIGS. 1A to 1C show one example of a concept of the present invention.

With reference to FIG. 1, an embodiment of the present invention will be explained.

First, an underlying insulating film 11 is formed over a substrate 10. The substrate 10 is a light-transmissive glass substrate or quartz substrate. Meanwhile, the underlying insulating film 11 is provided by forming an insulating film of a silicon oxide film, silicon nitride film or silicon oxide nitride film. Although the underlying layer 11 herein was shown as an example using a single-layer structure, it may use a structure having two or more of the insulating films. Note that the underlying insulating film may be omitted.

Then, a semiconductor film 12 is formed on the underlying insulating film. The semiconductor film 12 is provided by forming a semiconductor film having an amorphous structure deposited by known means (e.g. sputter process, LPCVD process or plasma CVD process). The semiconductor film 12 is formed in a thickness of 25–80 nm (preferably 30–60 nm). The semiconductor film, although not limited in material, is preferably formed of silicon or silicon-germanium (SiGe) alloy.

Subsequently, a laser crystallization method is carried out to form a crystalline semiconductor film. A laser crystallization method may be carried out after performing other known crystallizing process (thermal crystallization, or thermal crystallization using catalyst such as nickel). In this case, the laser to be used is desirably a continuously oscillating solid-state laser, gas laser or metal laser. Note that the solid-state laser includes a continuous oscillating YAG laser, $YVO_4$ laser, YLF laser, $YAlO_3$ laser, glass laser, ruby laser, alexandrite laser and Ti: sapphire laser. The gas laser includes a continuous oscillating KrF excimer laser, Ar laser, Kr laser and $CO_2$ laser. The metal laser includes a continuous oscillating helium-cadmium laser, copper vapor laser and gold vapor laser. Energy density is, e.g. approximately 0.01–100 $MW/cm^2$ (preferably 0.1–10 $MW/cm^2$) wherein irradiation is carried out by moving the stage at a velocity of approximately 0.5–2000 cm/s relatively to the laser light. Laser crystallization forms a plurality of convexes (ridges) on the surface of a crystalline semiconductor film.

Subsequently, a heating process is carried out. The heating process is made, e.g. in a nitrogen atmosphere, by turning on the eleven halogen lamps (infrared light) arranged under the substrate and ten above thereof for 1–60 seconds (preferably 30–60 seconds), 1–10 times (preferably 2–6 times). Although the heat to be supplied (as measured by a thermo-couple buried in a silicon wafer) by the halogen lamps is 700–1300° C., the conditions of the optimal heating process differ depending upon a state of a substrate or semiconductor film used, etc. and may be properly determined by a practitioner. However, the heating process, taking account of mass-production process, is desirably at approximately 700–750° C. for within 5 minutes.

Note that, although in this embodiment nitrogen atmosphere was used, used may be an inert gas, such as helium (He), neon (Ne) or argon (Ar). Meanwhile, although as the light source were used the halogen lamps, besides, ultraviolet light lamps, e.g. xenon lamps, are preferably used as a light source.

The ridges on the semiconductor film thus heat-processed are reduced as compared to the ridges of after laser crystallization. The TFTs fabricated using the semiconductor film will provide preferable electric characteristics.

EMBODIMENT

Embodiment 1

In order to confirm the effectiveness of the invention, the following experiment was conducted. This is explained using FIGS. 2A–2D and FIGS. 3A and 3B.

First, an underlying insulating film 11 is formed over a substrate 10. The substrate 10 is a light-transmissive glass substrate or quartz substrate. Meanwhile, the underlying insulating film 11 is provided by forming an insulating film of a silicon oxide film, silicon nitride film, silicon oxide nitride film or the like. Although the underlying film 11 herein was shown as an example using a single-layer structure, it may use a structure layered with two or more of insulating films noted above. Note that the underlying insulating film may be omitted. In this embodiment, a glass substrate was used. On the glass substrate, a silicon oxide nitride film was formed in a film thickness of 150 nm by the plasma CVD process.

Then, a semiconductor film 12 is formed on the underlying insulating film. The semiconductor film 12 is provided by a semiconductor film having an amorphous structure deposited by known means (e.g. sputter process, LPCVD process or plasma CVD process). The semiconductor film 12 is formed in a thickness of 25–80 nm (preferably 30–60 nm). The semiconductor film, although not limited in material, is preferably formed of silicon or silicon-germanium (SiGe) alloy. In this embodiment, an amorphous silicon film was formed in a thickness of 55 nm by the plasma CVD process.

Figure 2A:
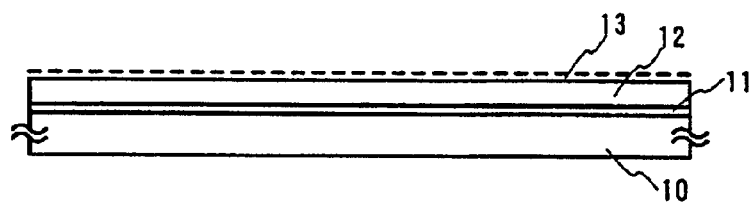
FIGS. 2A to 2D show one example of a concept of the invention.
Figure 2B:
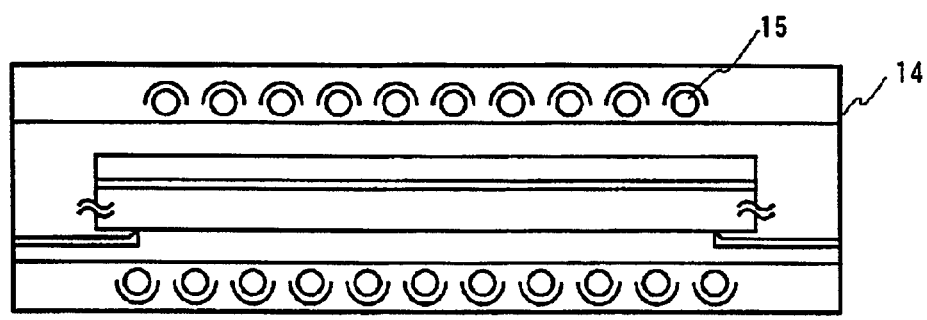
Figure 2C:
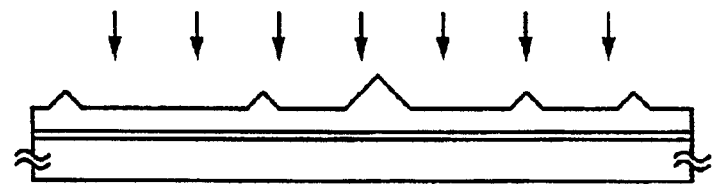

Subsequently, a laser crystallization method is carried out on the semiconductor film to form a crystalline semiconductor film. The laser crystallization method may be carried out after performing other known crystallizing process (thermal crystallization process, or thermal crystallization process using catalyst such as nickel). In this embodiment, a nickel acetate solution (weight-reduced concentration 10 ppm, volume 5 ml) is applied by spin coat onto the entire surface of the semiconductor film. Subsequently, a first heating process is carried out to crystallize the semiconductor film. In this embodiment, a heating process was performed in a nitrogen atmosphere at a temperature of 700° C. for 100 seconds by turning on the eleven halogen lamps (infrared light) 15 arranged under the substrate 11 and ten above thereof, 1–60 seconds (preferably 30–60 seconds), 1–10 times (preferably 2–6 times) (FIG. 2B). Next, laser light is irradiated to improve the crystalinity in the semiconductor film. In this embodiment, an excimer laser was irradiated through an optical-system to provide a linear form on an irradiated plane. This improved the crystallinity in the semiconductor film. However, a plurality of convexes (ridges) are formed in the semiconductor film surface by the laser irradiation. (FIG. 2C)

Figure 2D:
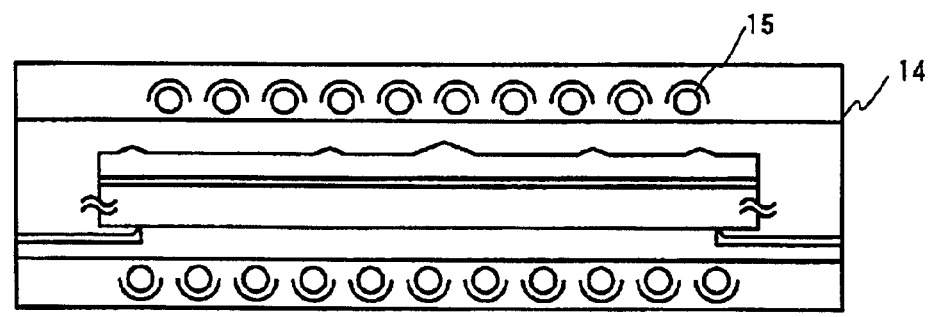

Subsequently, a second heating process is carried out. The heating process is carried out, e.g. in a nitrogen atmosphere by turning on the eleven halogen lamps (infrared light) 15 arranged under the substrate 11 and ten above thereof, 1–60 seconds (preferably 30–60 seconds), 1–10 times (preferably 2–6 times). The heat to be supplied by the halogen lamps (measured by a thermo-couple buried in a wafer) is 700–1300° C. However, the optimal heating-process condition is different depending on a semiconductor film state or the like, and hence may be properly determined by a practitioner. However, the heating process, taking account of mass-production process, is desirably at approximately 700–750° C. for within 5 minutes. In this embodiment, a heating process was done in a nitrogen atmosphere at a temperature sharing 700° C. and 750° C. for 4 minutes (FIG. 2D).

Figure 3A:
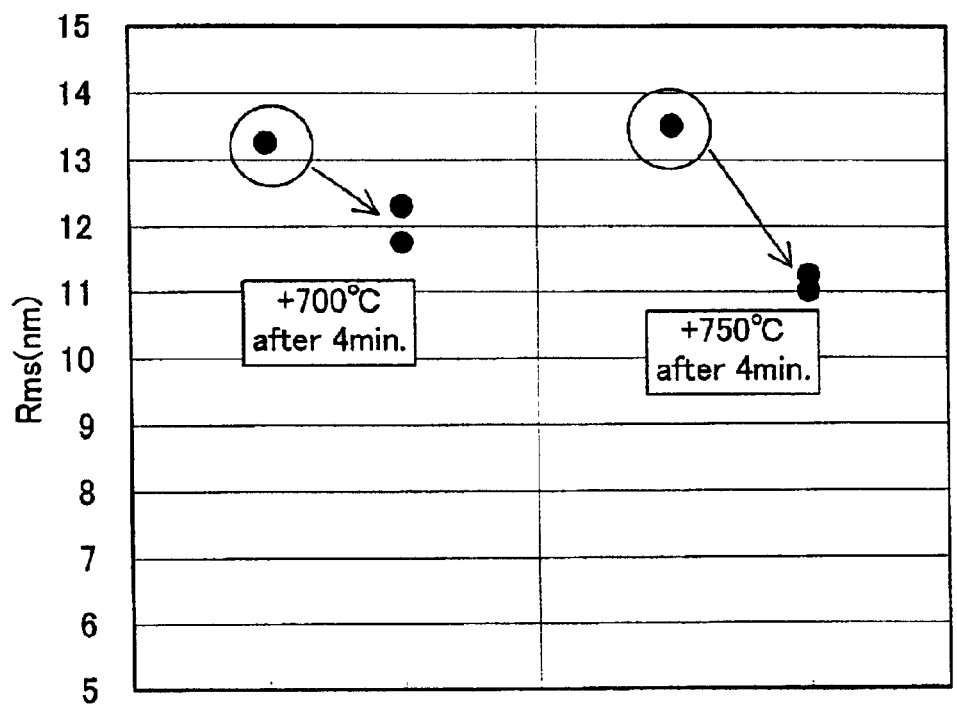
FIGS. 3A to 3B show one example of the effectiveness due to the invention.
Figure 3B:
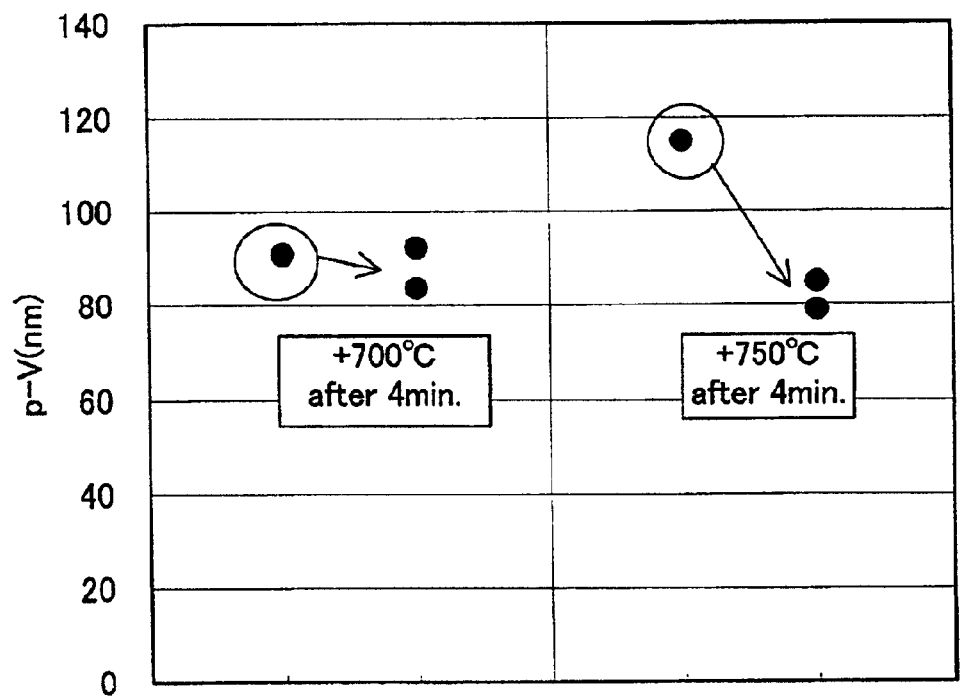

The ridges on the semiconductor film, before and after the second heating process, was measured for square mean roughness (Rms) and P-V by the use of an AFM, a result of which is shown in FIGS. 3A and 3B. From these figures, it is seen that the ridge is reduced after the second heating process.

As in the above, it was confirmed that the invention is extremely effective for reducing the ridge. The TFTs fabricated using a semiconductor film as above provide favorable electric characteristics.

Embodiment 2

Figure 1B:
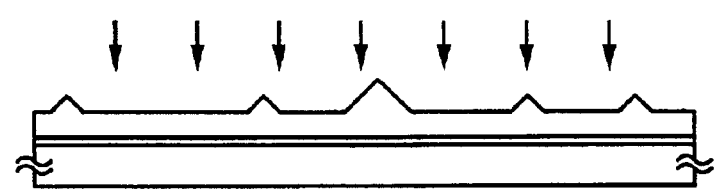
Figure 1C:
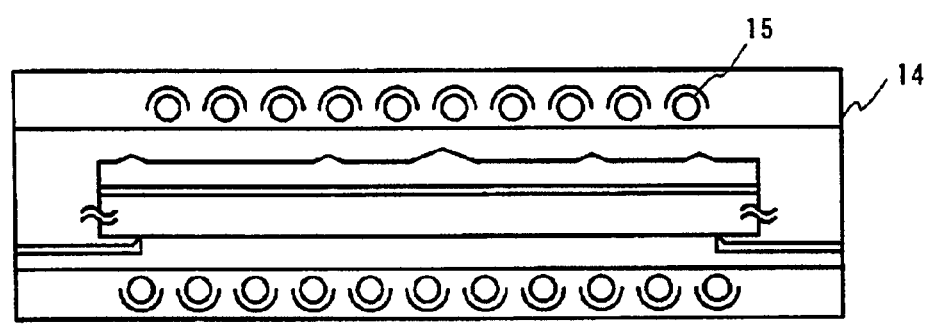

This embodiment explains a method for reducing the ridge by irradiating intense light through a different fabrication process from that of Embodiment 1, using FIGS. 1A to 1C.

First, an underlying insulating film and a semiconductor film are formed according to Embodiment 1.

Subsequently, a laser crystallization method is carried out to crystallize the semiconductor film. A laser crystallization method may be carried out after performing other known crystallizing process (thermal crystallization process, or thermal crystallization process using catalyst such as nickel). In this embodiment, a YAG-laser second harmonic wave was irradiated, which is formed in a linear shape on an irradiated plane through optical-system. This caused crystallization of the semiconductor film. However, a plurality of convexes (ridges) are formed in the semiconductor film surface. (FIG. 1B)

Subsequently, a heating process is carried out. The heating process is carried out, e.g. in a nitrogen atmosphere by turning on the eleven halogen lamps (infrared light) 15 arranged under the substrate 11 and ten above thereof, 1–60 seconds (preferably 30–60 seconds), 1–10 times (preferably 2–6 times). The heat to be supplied by the halogen lamps (measured by a thermocouple buried in a silicon wafer) is 700–1300° C. However, the optimal heating-process condition is different depending on a semiconductor film state or the like, and hence may be properly determined by a practitioner. However, the heating process, taking account of mass-production process, is desirably at approximately 700–750° C. for within 5 minutes. In this embodiment, a heating process is carried out in a nitrogen atmosphere at a temperature of 725° C. for 5 minutes. (FIG. 1C)

Note that, although in this embodiment nitrogen atmosphere was used, used may be an inert gas, such as helium (He), neon (Ne) or argon (Ar). Meanwhile, although as the light source were used the halogen lamps, besides, ultraviolet light lamps, e.g. xenon lamps, are preferably used as a light source.

The ridge on the semiconductor film formed through the above heating process is reduced as compared to the ridge of after laser crystallization. The TFTs fabricated using a semiconductor film as above will provide favorable electric characteristics.

Embodiment 3

This embodiment explains a method for reducing the ridge by irradiating intense light through a different manufacturing process from those of Embodiments 1 and 2, using FIGS. 2A to 2D.

First, an underlying insulating film and a semiconductor film are formed according to Embodiment 1.

Subsequently, a laser crystallization method is carried out to crystallize the semiconductor film. A laser crystallization method may be carried out after performing other known crystallizing process (thermal crystallization process, or thermal crystallization process using catalyst such as nickel). In this embodiment, nickel 13 is introduced into the semiconductor film by a sputter process. (FIG. 2A) Then, a first heating process is performed to crystallize the semiconductor film. In this embodiment, although not shown, thermal anneal is carried out using a furnace anneal furnace. Exposure is made in an nitrogen atmosphere at a temperature of 550° C. for 4 hours. Next, laser light is irradiated to improve the crystallinity in the semiconductor film. In this embodiment, an excimer laser was irradiated by formation through optical-system into a linear form on an irradiated plane. This improved the crystallization in the semiconductor film. However, a plurality of convexes (ridges) are formed in the semiconductor film surface. (FIG. 2C)

Subsequently, a second heating process is carried out. The heating process is carried out, e.g. in a nitrogen atmosphere by turning on the eleven halogen lamps (infrared light) 15 arranged under the substrate 11 and ten above thereof, 1–60 seconds (preferably 30–60 seconds), 1–10 times (preferably 2–6 times). The heat to be supplied by the halogen lamps (measured by a thermo-couple buried in a silicon wafer) is 700–1300° C. However, the optimal heating-process condition is different depending on a semiconductor film state or the like, and hence may be properly determined by a practitioner. However, the heating process, taking account of mass-production process, is desirably at approximately 700–750° C. for within 5 minutes. In this embodiment, a heating process was carried out in a nitrogen atmosphere at a temperature of 700° C. for 4 minutes. (FIG. 2D)

Note that, although in this embodiment nitrogen atmosphere was used, used may be an inert gas, such as helium (He), neon (Ne) or argon (Ar). Meanwhile, although as the light source were used the halogen lamps, besides, ultraviolet light lamps, e.g. xenon lamps, are preferably used as a light source.

The ridge on the semiconductor film formed through the above heating process is reduced as compared to the ridge of after laser crystallization. The TFTs fabricated using a semiconductor film as above will provide favorable electric characteristics.

Embodiment 4

Figure 17A:
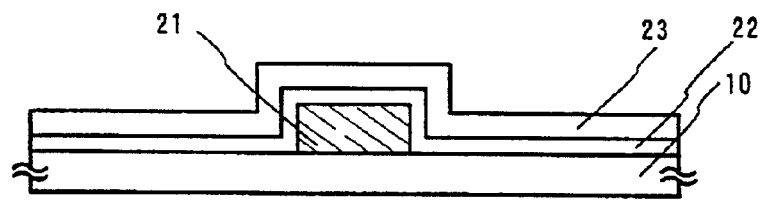
FIGS. 17A to 17C show a concept of the invention.
Figure 17B:
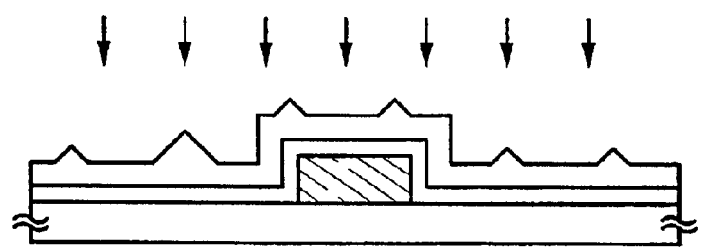
Figure 17C:
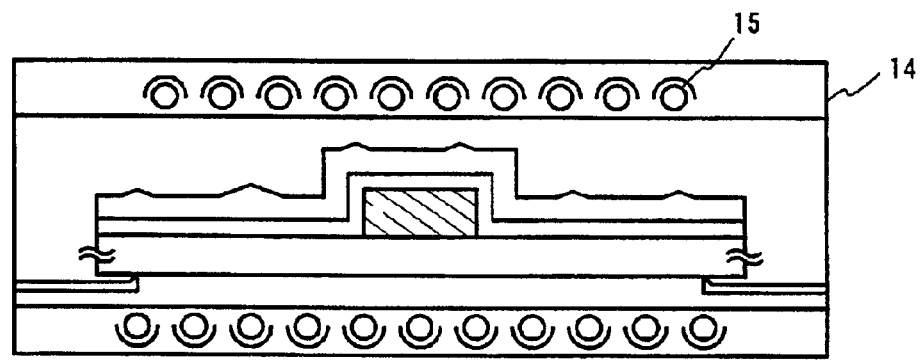

This embodiment explains a method for reducing the ridge by irradiating intense light through a different process from those of Embodiment 1 to 3, by using FIGS. 17A to 17C.

First, used is a light-transmissive glass substrate or quartz substrate. In this embodiment used is a glass substrate as a substrate 10.

A conductor film is formed and etched into a conductor firm 21 in a desired form. The material of the conductor film, although not especially limited, is a heat-resisting material, i.e. an element selected from Ta, W, Ti, Mo, Cu, Cr and Nd, or may be formed of an alloy material or compound material based on the element. Meanwhile, a semiconductor film such as a crystalline silicon film doped with an impurity such as phosphorus may be used. Otherwise, an AgPdCu alloy may be used. The conductor film may be of a laminated layer instead of a single layer. In this embodiment formed is a conductor film 21 of a W film having a film thickness of 400 nm.

As an insulating film 22 is formed an insulating film such as a silicon oxide film, a silicon nitride film or a silicon oxide nitride film. In this embodiment formed is a silicon oxide film having a film thickness of 150 nm by a plasma CVD process.

A semiconductor film 23 is provided on the insulator film. The semiconductor film 23 is formed by depositing a semiconductor film having an amorphous structure by known means (sputter process, LPCVD process, plasma CVD process or the like). The semiconductor film 23 is formed in a thickness of 25–80 nm (preferably 30–60 nm). The material of the semiconductor film, although not limited, is preferably formed of silicon or silicon-germanium (SiGe) alloy. In this embodiment formed is an amorphous silicon film having a film thickness of 55 nm by a plasma CVD process. (FIG. 17A)

Then, a laser crystallization method is carried out to crystallize the semiconductor film. The laser crystallization method may be carried out after performing other known crystallizing process (thermal crystallization process, or thermal crystallization process using catalyst such as nickel). In this embodiment, a second harmonic wave of YAG laser was irradiated by formation through an optical-system into a linear form on an irradiated plane. This improved the crystallinity in the semiconductor film. However, a plurality of convexes (ridges) are formed in the semiconductor film surface by the laser irradiation. (FIG. 17B).

Subsequently, a heating process is carried out. The heating process is carried out, e.g. in a nitrogen atmosphere, by turning on the eleven halogen lamps (infrared light) arranged under the substrate and ten above thereof, 1–60 seconds (preferably 30–60 seconds), 1–10 times (preferably 2–6 times). Although the heat to be supplied (as measured by a thermo-couple buried in a silicon wafer) by the halogen lamps is 700–1300° C., the optimal heating process conditions differ depending upon a state of a semiconductor film used, etc. and may be properly determined by a practitioner. However, the heating process, taking account of mass-production process, is desirably at approximately 700–750° C. for within 5 minutes. In this embodiment performed is a heating process in a nitrogen atmosphere at a temperature of 725° C. for 5 minutes (FIG. 17C).

Note that, although in this embodiment used was nitrogen atmosphere, used may be an inert gas, such as helium (He), neon (Ne) or argon (Ar). Meanwhile, although as the light source used were the halogen lamps, besides, ultraviolet light lamps, e.g. xenon lamps, are preferably used as a light source.

The ridges on the semiconductor film thus heat-processed are reduced as compared to the ridges of after laser crystallization. The TFTs fabricated using such a semiconductor film will provide preferable electric characteristics.

Embodiment 5

This embodiment explains a manufacturing method for an active-matrix substrate, using FIG. 4A thru FIG. 8.

First, in this embodiment used is a substrate 320 of barium boro-silicate glass represented by Coning #7059 glass or #1737 glass or aluminum boro-silicate glass. Incidentally, the substrate 320 may be a quartz substrate, silicon substrate, metal substrate or stainless-steel substrate having an insulating film formed on a surface thereof. Otherwise, may be used a plastic substrate having heat resistance to withstand at the process temperature in the embodiment.

Then, an underlying film 321 of an insulating film, such as a silicon oxide film, silicon nitride film or silicon oxide nitride film, is formed on the substrate 320. Although in the embodiment used is a two-layer structure as an underlying film 321, the structure may be of a single layer of the foregoing insulating film or a lamination of two or more layers thereof. The underlying film 321 has, as a first layer, a silicon oxide nitride film 321a deposited in a film thickness of 10–200 nm (preferably 50–100 nm) by a plasma CVD process using a reactive gas of $SiH_4$, $NH_3$ and $N_2O$. In the embodiment formed was a silicon oxide nitride film 321a (composition ratio of Si=32%, O=27%, N=24%, H=17%) with a film thickness of 50 nm. Then, as a second film of the underlying layer 321, a plasma CVD process is used to deposit, with a reactive gas of $SiH_4$, and $N_2O$, a silicon oxide nitride film 321b to a thickness of 50–200 nm (preferably 100–150 nm). In this embodiment formed is a silicon nitride film 321b (composition ratio of Si=32%, O=59%, N=7%, H=2%) having a film thickness of 100 nm.

Then, a semiconductor film 322 is formed on the underlying film. The semiconductor film 322 is provided by a semiconductor film having an amorphous structure formed in a thickness of 25–80 nm (preferably 30–60 nm) by known process (sputter process, LPCVD process or plasma CVD process). The material of the semiconductor film, although not limited, is preferably formed of silicon or silicon-germanium (SiGe) alloy. Subsequently, a known crystallizing process (laser crystallizing process, thermal crystallizing process, thermal crystallizing process using a catalyst such as nickel, or the like) is performed to crystallize the semiconductor film. The obtained crystalline semiconductor film is patterned into a desired form to form semiconductor layers 402–406. This embodiment applies a laser crystallizing process.

In the case of applying also a laser crystallizing process, it is possible to employ a pulse oscillating or continuous-emitting excimer laser, YAG laser, $YVO_4$ laser or the like. Where using such a laser, desirably used is a process that the laser beam irradiated from a laser oscillator is focused by an optical system into a linear form and irradiated to the semiconductor film. Although the conditions for crystallization are properly selected by a practitioner, an excimer laser used has a pulse oscillation frequency of 300 Hz and a laser energy density of 100–800 $mJ/cm^2$ (typically 200–700 $mJ/cm^2$). Meanwhile, where using a YAG laser, a second harmonic wave thereof is desirably used with a pulse oscillation frequency of 1–300 Hz and a laser energy density of 300–1000 $mJ/cm^2$ (typically 350–800 $mJ/cm^2$). A laser beam focused in a linear form having a width 100–1000 $\mu m$, e.g. 400 $\mu m$, is irradiated onto the entire surface of the substrate. In this case, it is possible to provide an overlap ratio of linear laser beam (overlap ratio) of 50–98%.

Subsequently, in order to reduce the ridge formed by laser light irradiation, intense light is illuminated. For example, the process is carried out in a nitrogen atmosphere, by turning on eleven halogen lamps (infrared light) 15 arranged under the substrate 11 and ten above thereof, 1–60 seconds (preferably 30–60 seconds), 1–10 times (preferably 2–6 times). The heat to be supplied by the halogen lamps (measured by a thermo-couple buried in a silicon wafer) is 700–1300° C. However, the optimal heating-process condition is different depending on a semiconductor film state or the like, and hence may be properly determined by a practitioner. However, the heating process, taking account of mass-production process, is desirably at approximately 700–750° C. for within 5 minutes. In this embodiment is carried out exposure in a nitrogen atmosphere at 700° C. for 4 minutes.

After forming the semiconductor layers 402–406, a slight amount of impurity element (boron or phosphorus) may be doped in order to control threshold for TFTs.

Then, a gate dielectric film 407 is formed covering the semiconductor layers 402–406. The gate dielectric film 407 is formed by an insulating film containing silicon in a thickness of 40–150 nm by a plasma CVD process or sputter process. In this embodiment was formed a silicon oxide nitride film (composition ratio of Si=32%, O=59%, N=7%, H=2%) in a thickness of 110 nm by the plasma CVD process. The gate dielectric film is not limited to a silicon oxide nitride film, i.e. may be an insulating film containing other form of silicon in a single-layer or laminated structure.

Meanwhile, a silicon oxide film used can be formed by a plasma CVD process wherein TEOS (Tetraethyl Orthosilicate) is mixed with $O_2$ and discharging at a reaction pressure 40 Pa, a substrate temperature 300–400° C. and a high-frequency (13.56 MHz) electric-power density 0.5–0.8 $W/cm^2$. The silicon oxide film thus formed can there after obtain a preferred characteristic as a gate dielectric film by a thermal anneal at 400–500° C.

Figure 4A:
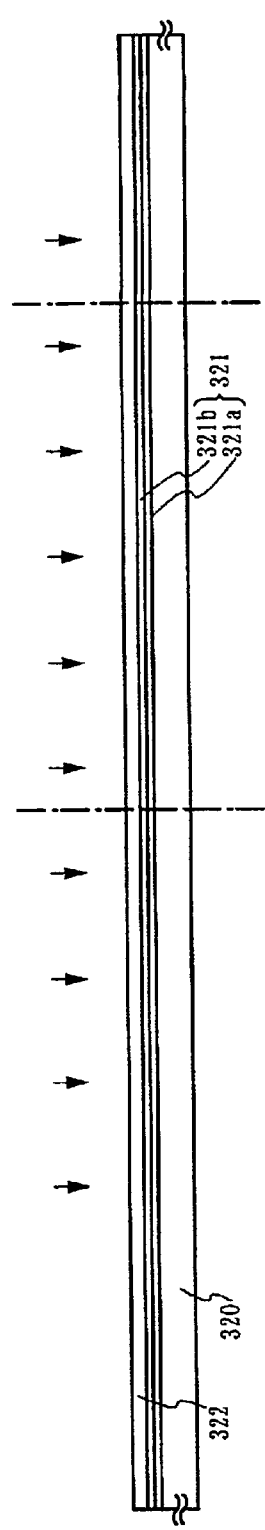
FIGS. 4A to 4D are sectional views showing a manufacturing process example of a pixel TFT and drive-circuit TFT.
Figure 4B:
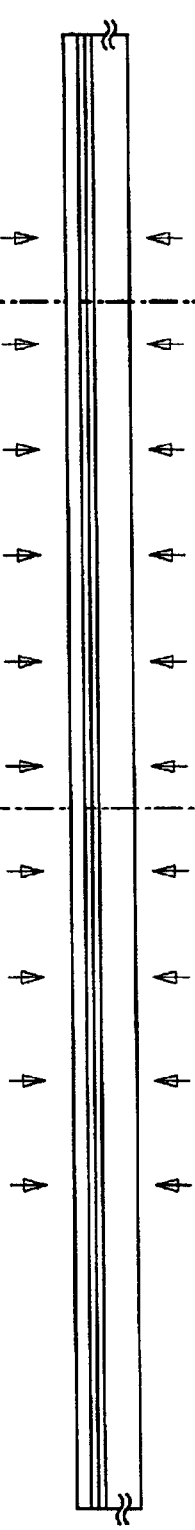
Figure 4C:
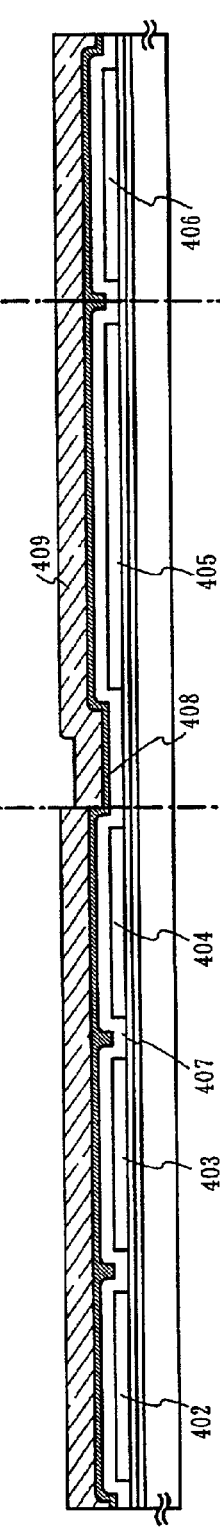
Figure 4D:
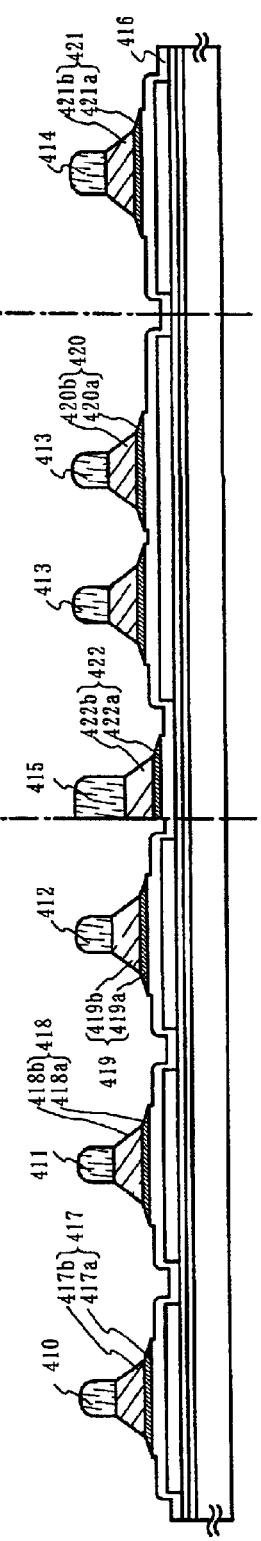

Then, as shown in FIG. 4C, on the gate dielectric film 407 are formed a first conductor film 408 having a film thickness 20–100 nm and a second conductor film 409 having a film thickness 100–400 nm. In this embodiment was formed a lamination of a first conductor film 408 of a TaN film having a film thickness 30 nm and a second conductor film 409 of a W film having a film thickness 370 nm. The TaN film was formed by a sputter process wherein sputter was done using a target of Ta in an atmosphere containing nitrogen.

Meanwhile, the W film was formed by a sputter process using a target of W. Otherwise, formation is possible by a thermal CVD process using tungsten hexafluoride ($WF_6$). In any case, resistance reduction is required for use as a gate electrode, and the resistivity of W film is desirably 20 $\mu\Omega$cm or less. Although the W film can be reduced in resistivity by increasing the grain size, where there are much impurity elements such as oxygen in the W film, crystallization is impeded to have increased resistivity. Accordingly, in this embodiment was formed a W film by a sputter process using a high purity of W (purity 99.9999%) target with further consideration not to be mixed with impurity from a gas phase during deposition, thereby realizing a resistivity of 9–20 $\mu\Omega$cm.

Incidentally, in this embodiment although the first conductor film 408 is by TaN and the second conductor film 409 by W, they are not limited. Any of them may be formed of an element selected from Ta, W, Ti, Mo, Al, Cu, Cr and Nd, or an alloy material or compound material based on the element. Meanwhile, may be used a semiconductor film represented by a crystalline silicon film doped with an impurity element such as phosphorus. Meanwhile, AgPdCu alloy may be used. Meanwhile, it is possible to use a combination that the first conductor film is formed by a tantalum (Ta) film and the second conductor film by a W film, a combination that the first conductor film is formed by a titanium nitride (TiN) film and the second conductor film by a W film, a combination that the first conductor film is formed by a tantalum nitride (TaN) film and the second conductor film by an Al film, or a combination that the first conductor film is formed by a tantalum nitride (TaN) film and the second conductor film by a Cu film.

Next, a photolithography process is used to form a resist mask 410–415, to perform a first etch process for forming an electrode and interconnection. The first etch process is carried out under first and second etch conditions. In this embodiment used was an ICP (Inductively Coupled Plasma) etch technique as a first etch condition wherein etching was carried out using an etch gas of $CF_4$, $Cl_2$ and $O_2$ to provide a gas flow ratio of respectively 25:25:10 (s c c m) to cause a plasma by applying an RF (13.56 MHz) power of 500 W to a coil-formed electrode at a pressure of 1 Pa. Herein, used was a dry etching apparatus (Model E645-ICP) using an ICP manufactured by Matsushita Electric Co. An RF (13.56 MHz) power of 150 W is applied also to a substrate end (sample stage) to apply substantially a negative self-bias voltage. The W film is etched under the first etch condition to form an end of the first conductor layer into a taper form.

Thereafter, the resist mask 410–415 is maintained without removal, and subjected under a second etch condition. $CF_4$ and $Cl_2$ are used in an etch gas to provide a gas flow rate ratio of respectively 30:30 (s c c m) to cause a plasma by applying an RF (13.56 MHz) power of 500 W to the coil formed electrode at a pressure of 1 Pa, thereby performing etching for approximately 30 seconds. An RF (13.56 MHz) power of 20 W is applied also to the substrate end (sample stage), thus applying substantially a negative self-bias voltage. The W film and the TaN film are etched in the same degree under the second etch condition mixed with $CF_4$ and $Cl_2$. Incidentally, in order to carry out etching without leaving residue on the gate dielectric film, etch time is desirably increased at a percentage of approximately 10–20%.

In the first etch process, by making the resist mask form to a proper one, the effect of the bias voltage applied to the substrate end provides a taper form at the end of the first conductor layer and second conductor layer. The taper is given an angle of 15–45 degrees. In this manner, the first etch process forms a first-form conductor layer 417–422 having a first conductor layer and second conductor layer (first conductor layer 417a–422a and second conductor layer 417b–422b). 416 is a gate dielectric film, wherein the region not covered with the first-form conductor layer 417–422 is formed with a region etched and reduced in thickness by approximately 20–50 nm.

Then, a first doping process is carried out without removing the resist mask, to add an n-type-providing impurity and an inert gas element for gettering the metal element used in promoting crystallization to the semiconductor film. (FIG. 5A) the doping process may be conducted by an ion dope technique or ion implant technique. The ion dope process is carried out under a condition of a dose of $1\times10^{13}$–$5\times10^{15}$/$cm^2$ and an acceleration voltage of 60–100 keV. In this embodiment, the dose was $1.5\times10^{15}$ $cm^2$ and the acceleration voltage was 80 keV. The impurity element for providing n-type uses an element belonging to group 15, typically phosphorus (P) or arsenic (As). Phosphorus (P) was used herein. Also, argon was used as an inert gas element. In this case, the conductor layer 417–421 serves as a mask against the n-type-providing impurity element, to form a first high concentration impurity region 306–310 in a self-aligned fashion. The first high concentration impurity region 306–310 is added by an n-type-providing impurity element in a concentration range of $1\times10^{20}$–$1\times10^{21}$/$cm^2$. On the other hand, argon was implanted at a dose of $2\times10^{15}$/$cm^2$ with an acceleration voltage of 90 keV.

Then, a second etch process is carried out without removing the resist mask. Herein, the etch gas uses $CF_4$, $Cl_2$ and $O_2$ to selectively etch the W film. At this time, by the second etch process, a second conductor layer 428b–433b is formed. On the other hand, a second-form conductor layer 428–433 is formed without substantial etching on the first conductor layer 417a–422a.

Figure 5A:
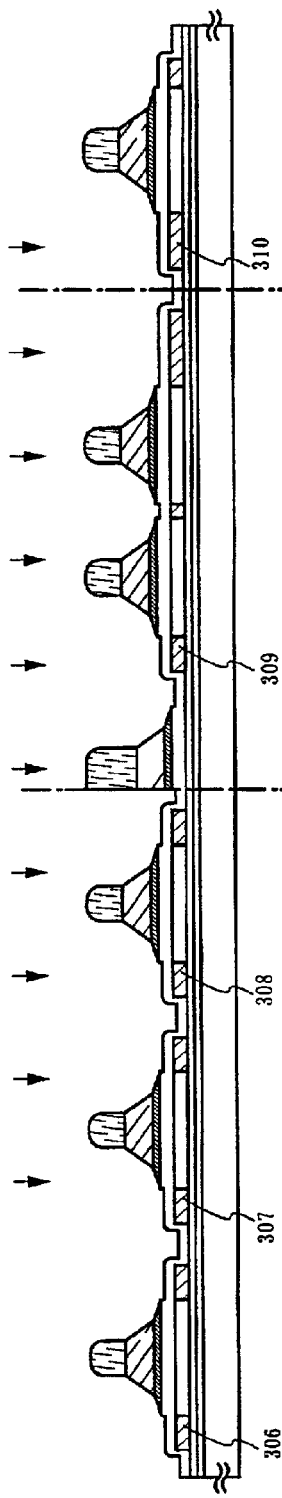
FIGS. 5A to 5C are sectional views for showing a manufacturing process example of a pixel TFT and drive-circuit TFT.
Figure 5B:
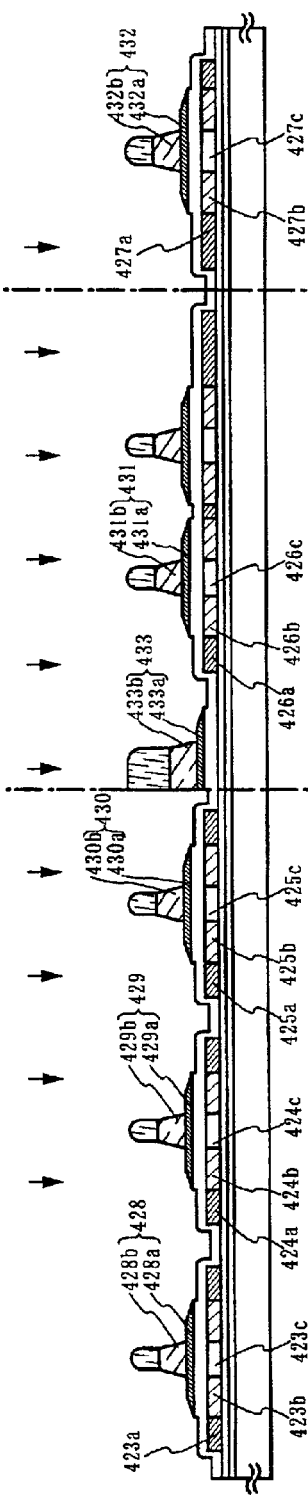

Next, as shown in FIG. 5B, a second doping process is carried out without removing the resist mask. In this case, an n-type-providing impurity is introduced at a high acceleration voltage of 70–120 keV with a dose reduced lower than that of the first doping process. In this embodiment, the dose was $1.5\times10^{14}$/$cm^2$ and the acceleration voltage was 90 keV. In the second doping process, the second-form conductor layer 428–433 is used as a mask to introduce impurity element also to the semiconductor layer underneath the second conductor layer 428b–433b, thereby newly forming a second high concentration impurity region 423a–427a and low concentration impurity region 423b–427b.

Figure 5C:
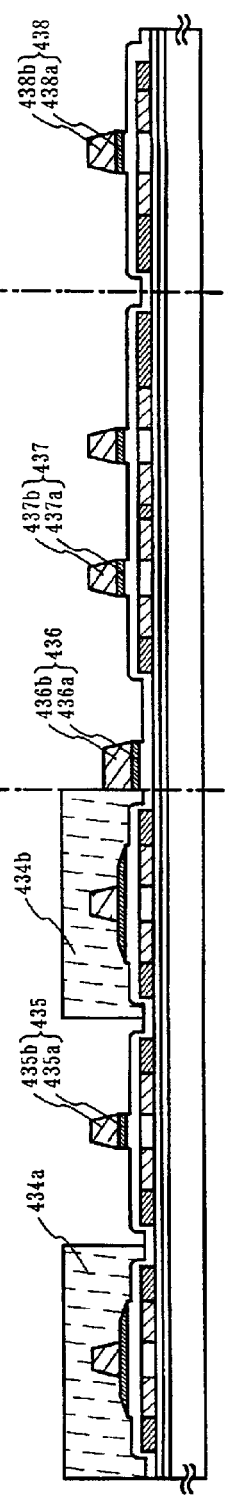

Then, after removing the resist mask, a resist mask 434a and 434b is newly formed to carry out a third etching, as shown in FIG. 5C. $CF_4$ and $Cl_2$ are used in an etch gas to provide a gas flow rate ratio of 50/10 (s c c m) to cause a plasma by applying an RF (13.56 MHz) power of 500 W to the coil-formed electrode at a pressure of 1.3 Pa, thereby performing etching for approximately 30 seconds. An RF (13.56 MHz) power of 10 W is applied to the substrate end (sample stage) to apply substantially a negative self-bias voltage. In this manner, the third etch process etches the TaN film for p-channel TFTs and pixel TFTs, thus forming a third form conductor film 435–438.

Then, after removing the resist mask, the second form conductor layer 428, 430 and the second form conductor layer 435–438 are used as a mask to selectively remove the gate dielectric film 416 thereby forming an insulating layer 439–444. (FIG. 6A)

Then, a resist mask 445a–445c is newly formed to carry out a third doping process. The third doping process forms impurity regions 446, 447 added with an impurity element providing a conductivity opposite to the one conductivity type to the semiconductor layer for a p-channel TFT active layer. The second conductor layers 435a, 438a are used as a mask against an impurity element to add a p-type-providing impurity element, forming an impurity region in a self-aligned fashion. In this embodiment is formed impurity regions 446, 447 by an ion dope technique using diborane ($B_2H_6$). (FIG. 6B) During the third doping process, the semiconductor layer for forming an n-channel TFT is covered by the resist mask 445a–445c. The impurity regions 446, 447 are added by different concentration of phosphorus due to the first doping process and second doping process. In any of the regions, doping process is carried out to provide a concentration of p-type-providing impurity element of $2\times10^{20}$–$2\times10^{21}$/cm$^3$, thereby not causing any problem in functioning as source and drain regions for a p-channel TFT. This embodiment, because the semiconductor layer for a p-channel TFT active layer in part is exposed, has a merit to easily add an impurity element (boron).

The process so far forms impurity regions in the respective semiconductor layers.

Then, the resist mask 445a–445c is removed to form a first interlayer insulating film 461. The first interlayer insulating film 461 is formed by an insulating film containing silicon having a thickness of 100–200 nm by the use of a plasma CVD or sputter technique. In this embodiment was formed a silicon oxide nitride film having a film thickness of 150 nm by the plasma CVD technique. The first interlayer insulating film 461 is not limited to a silicon oxide nitride film but may be formed by other insulating layer containing silicon in a single-layer or laminated structure.

Then, as shown in FIG. 6C, a heating process is carried out to restore the crystallinity in the semiconductor layers and activate the impurity element added to the respective semiconductor layers. This heating process is carried out by a thermal anneal method using a furnace anneal furnace. The thermal anneal method may be carried out in a nitrogen atmosphere having an oxygen concentration of 1 ppm or less, preferably 0.1 ppm or less, at a temperature of 400–700° C., typically 500–550° C. In this embodiment was carried out an activation process at 550° C. for 4 hours. Note that, besides thermal anneal method, laser anneal method or rapid thermal anneal method (RTA method) can be applied.

Incidentally, in this embodiment are crystallized the impurity regions 423a, 425a, 426a, 446a, 447a where the nickel used as a catalyst in crystallization contains phosphorus. Consequently, the metal element is gettered into the impurity region, thus reducing the nickel concentration in the semiconductor layer in a portion to be mainly formed into a channel region. The TFT having a channel region thus formed has a lowered off-current value and a favorable crystallinity to thereby obtain a high electric-field mobility, thus achieving a favorable characteristic.

Meanwhile, a heating process may be carried out before forming a first interlayer film. However, where an interconnect material used is thermally weak, it is preferred to carry out a heating process after forming an interlayer film (insulating film based on silicon, e.g. silicon nitride film) in order to protect interconnects, etc. as in this embodiment.

In the case of not carrying out a heating process simultaneously in the laser anneal process, it is desired to carry out a process for hydrogenating the semiconductor layer by a heating process in an atmosphere containing 3–100 hydrogen at 300–550° C. for 1–12 hours. In this embodiment was carried out a heating process in a hydrogen atmosphere containing about 3% hydrogen at 410° C. for 1 hour. This process is a process to terminate the dangling bond in the semiconductor layer by the hydrogen contained in the interlayer film. As other means for hydrogenation, plasma hydrogenation (using the hydrogen excited by plasma) may be carried out.

Then, a second interlayer insulating film 462 is formed of an inorganic insulating film material or organic insulating film material on the first interlayer insulating film 461. In this embodiment, although formed was an acryl resin film having a film thickness of 1.6 µm, used was a viscosity of 10–1000 cp, preferably 40–200 cp, to form concavo-convex in the surface.

In this embodiment formed was a second interlayer insulating film 462 having concavo-convex in the surface in order to prevent mirror reflection, thereby forming concavo-convex in a surface of the pixel electrode. Meanwhile, in order to provide concavo-convex in the pixel electrode surface for achieving scattering of light, a convex may be formed in the region below the pixel electrode. In such a case, because the convex can be formed by the same photomask as in the TFT formation, there is no increase of the number of processes in the formation. Incidentally, the convex may be properly provided on the surface in a pixel region other than the interconnect and TFT regions. In this manner, concavo-convex is formed in the surface of the pixel electrode along the concavo-convex formed in the surface of the insulating film covering the convex.

Meanwhile, the second interlayer insulating film 462 may use a film to planarize the surface. In such a case, after forming a pixel electrode, a known sand blast process or etch process is preferably added to provide concavo-convex in a surface and prevent mirror reflection, thus causing scattering of reflection light to thereby increase whiteness.

Then, in a drive circuit 506, an interconnection 463–467 is formed for electrical connection to each impurity region. Incidentally, the interconnection is formed by patterning a laminated film having a Ti film having a film thickness 50 nm and an alloy film (alloy film Al and Ti) having a film thickness 500 nm.

Meanwhile, in a pixel region 507, formed are a pixel electrode 470, a gate interconnection 469 and a connection electrode 468. (FIG. 7) By the connection electrode 468, a source interconnection (lamination of 443b and 449) is electrically connected to a pixel TFT. Meanwhile, a gate interconnection 469 is electrically connected to a gate electrode of the pixel TFT. The pixel electrode 470 is electrically connected to a drain region 442 of the pixel TFT and further to a semiconductor layer 458 serving as one electrode to form hold capacitance. Meanwhile, the pixel electrode 470 desirably uses a material excellent in reflectance, such as a film based on Al or Ag or a lamination thereof.

By the above, it is possible to form, on the same substrate, a drive circuit 506 having a CMOS circuit having an n-channel TFT 501 and a p-channel TFT 502, and n-channel TFT 503 as well as a pixel region 507 having a pixel TFT 504 and hold capacitance 505. Thus, an active-matrix substrate is completed.

The n-channel TFT 501 of the drive circuit 506 has a channel region 423c, a low concentration impurity region 423b overlapped with the first conductor layer 428a forming a part of the gate electrode (GOLD region) and a high concentration impurity region 423a to function as a source or drain region. The p-channel TFT 502, forming a CMOS circuit by connection to the n-channel TFT 501 through an electrode 466, has a channel region 446d, impurity regions 446b, 446c formed on the outer sides of the gate electrode, and a high concentration impurity region 446a to function as a source or drain region. Meanwhile, the n-channel TFT 503 has a channel region 425c, a low concentration impurity region 425b overlapped with a first conductor layer 430a forming apart of the gate electrode (GOLD region) and a high concentration impurity region 425a to function as a source or drain region.

The pixel TFT 504 in the pixel region has a channel forming region 426c, a low concentration impurity region 426b formed on an outer side of the gate electrode (LDD region) and a high concentration impurity region 426a to function as a source or drain region. Meanwhile, the semiconductor layers 447a, 447b functioning as one electrode of a hold capacitance 505 are added with a p-type-providing impurity element, respectively. The hold capacitance 505, using an insulating film 444 as a dielectric, is formed by an electrode (lamination of 438a and 438b) and a semiconductor layer 447a–447c.

Meanwhile, the pixel structure of the embodiment is formed of an arrangement in which an end of the pixel electrode overlaps with the source interconnection, in such a manner to shade a gap between the pixel electrodes without using a black matrix.

Figure 7:
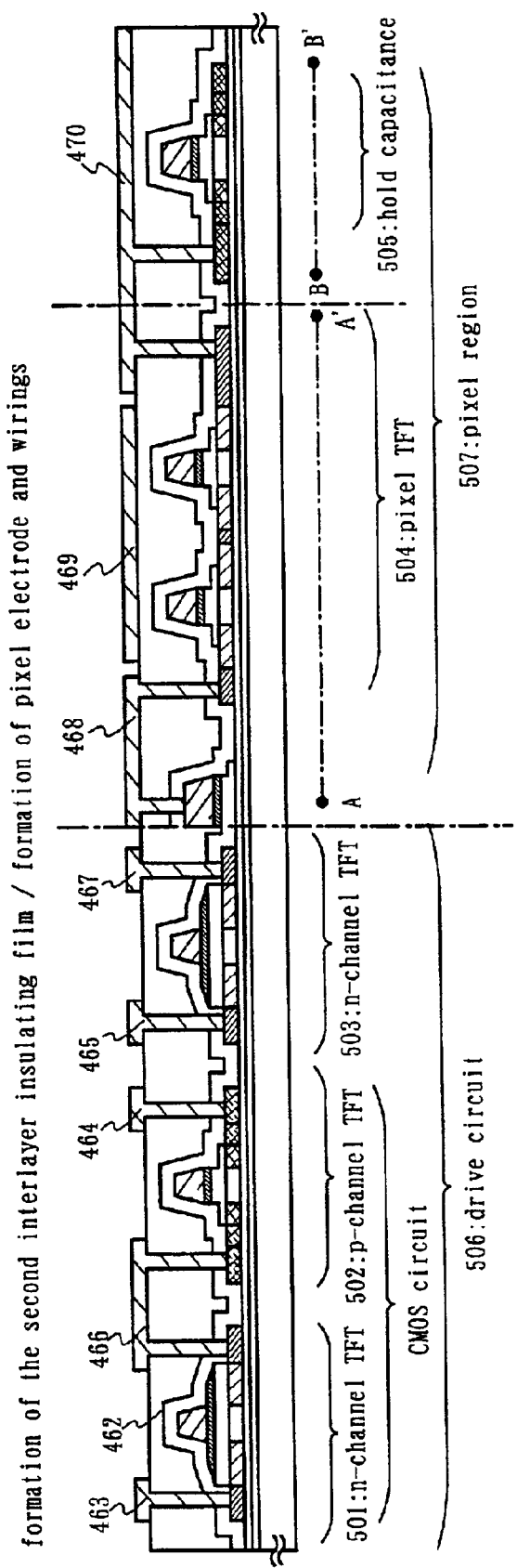
FIG. 7 is a sectional view showing a manufacturing process example of a pixel TFT and drive-circuit TFT.
Figure 8:
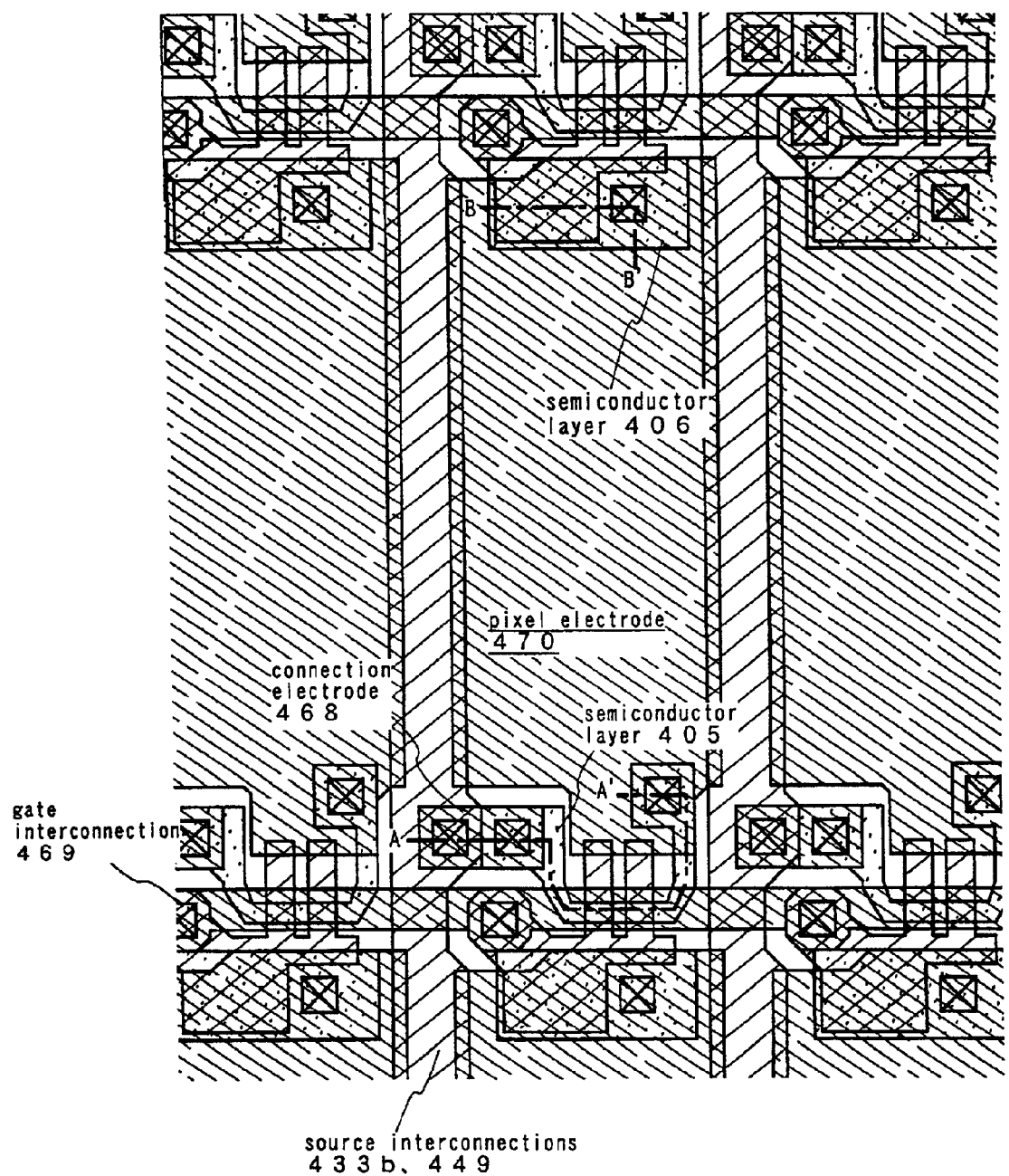
FIG. 8 is a top view showing a pixel in a pixel region.

Meanwhile, FIG. 8 shows a top view of the pixel region of the active-matrix substrate formed in this embodiment. Note that the parts corresponding to those of FIGS. 4 to 7 use the same reference numerals. The chain line A–A' in FIG. 7 corresponds to a sectional view taken on the chain line A–A' in FIG. 8. Meanwhile, the chain line B–B' in FIG. 7 corresponds to a sectional view taken on the chain line B–B' in FIG. 8.

Incidentally, this embodiment can be freely combined with Embodiments 1 to 4.

Embodiment 6

Figure 9:
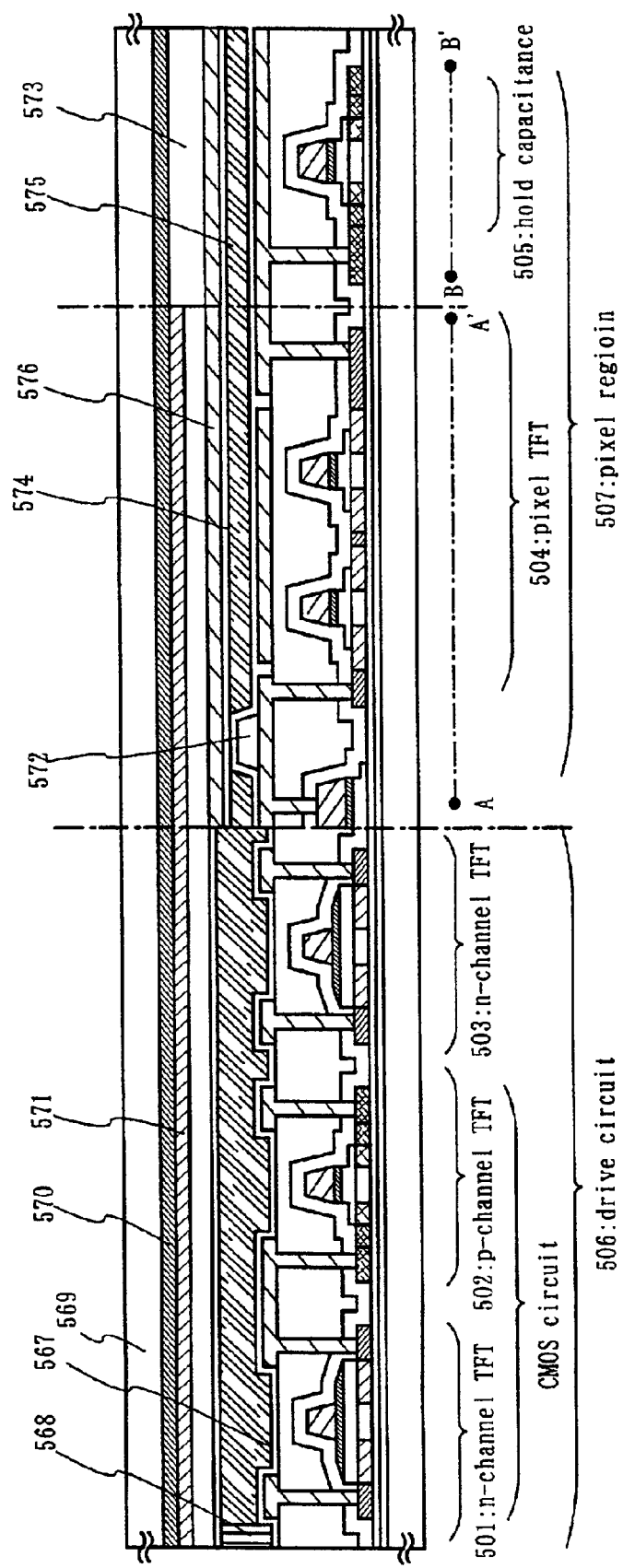
FIG. 9 is a sectional view showing a manufacturing process of an active-matrix liquid-crystal display device.

This embodiment explains, below, a process to manufacture a reflection type liquid crystal display device from the active-matrix substrate made in Embodiment 5, using FIG. 9.

First, after obtaining an active-matrix substrate in the state of FIG. 7 according to Embodiment 5, an orientation film 567 is formed at least on the pixel electrodes 470 on the active-matrix substrate of FIG. 7 and subjected to a rubbing process. Incidentally, in this embodiment, prior to forming an orientation film 567, an organic resin film such as an acryl resin film is patterned to form columnar spacers 572 in a desired position to support the substrates with a spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on a counter substrate 569. A shade region is formed by overlapping a red coloring layer 570 and a blue coloring layer 572 together. Meanwhile, the shade region may be formed by partly overlapping a red coloring layer and a green coloring layer.

In this embodiment is used a substrate shown in Embodiment 5. Accordingly, in FIG. 8 showing a top view of the pixel region of Embodiment 5, there is a need to shade at least the gap between the gate interconnection 469 and the pixel electrode 470, the gap between the gate interconnection 469 and the connection electrode 468 and the gap between the connection electrode 468 and the pixel electrode 470. In this embodiment were bonded together the substrates by arranging the coloring layers so that the shade region having a lamination of coloring layers is overlapped with the to-be-shaded region.

In this manner, the gaps between the pixels are shaded by the shading region having a lamination of coloring layers without forming a shading layer such as a black mask, thereby enabling to reduce the number of processes.

Then, a counter electrode 576 of a transparent conductor film is formed on the planarizing film 573 at least in the pixel region. An orientation film 574 is formed over the entire surface of the counter substrate and subjected to a rubbing process.

Then, the active-matrix substrate formed with the pixel region and drive circuit and the counter substrate are bonded together by a seal member 568. The seal member 568 is mixed with a filler so that the filler and the columnar spacers bond together the two substrates through an even spacing. Thereafter, a liquid crystal material 575 is poured between the substrates, and completely sealed by a sealant (not shown). The liquid crystal material 575 may be a known liquid crystal material. In this manner, completed is a reflection type liquid crystal display device shown in FIG. 9. If necessary, the active matrix substrate or counter substrate is divided into a desired shape. Furthermore, a polarizing plate (not shown) is bonded only on the counter substrate. Then, an FPC is bonded by a known technique.

The liquid crystal display panel manufactured as above can be used as a display part for an electronic appliance in various kinds.

Incidentally, this embodiment can be freely combined with Embodiments 1 to 5.

Embodiment 7

Figure 10:
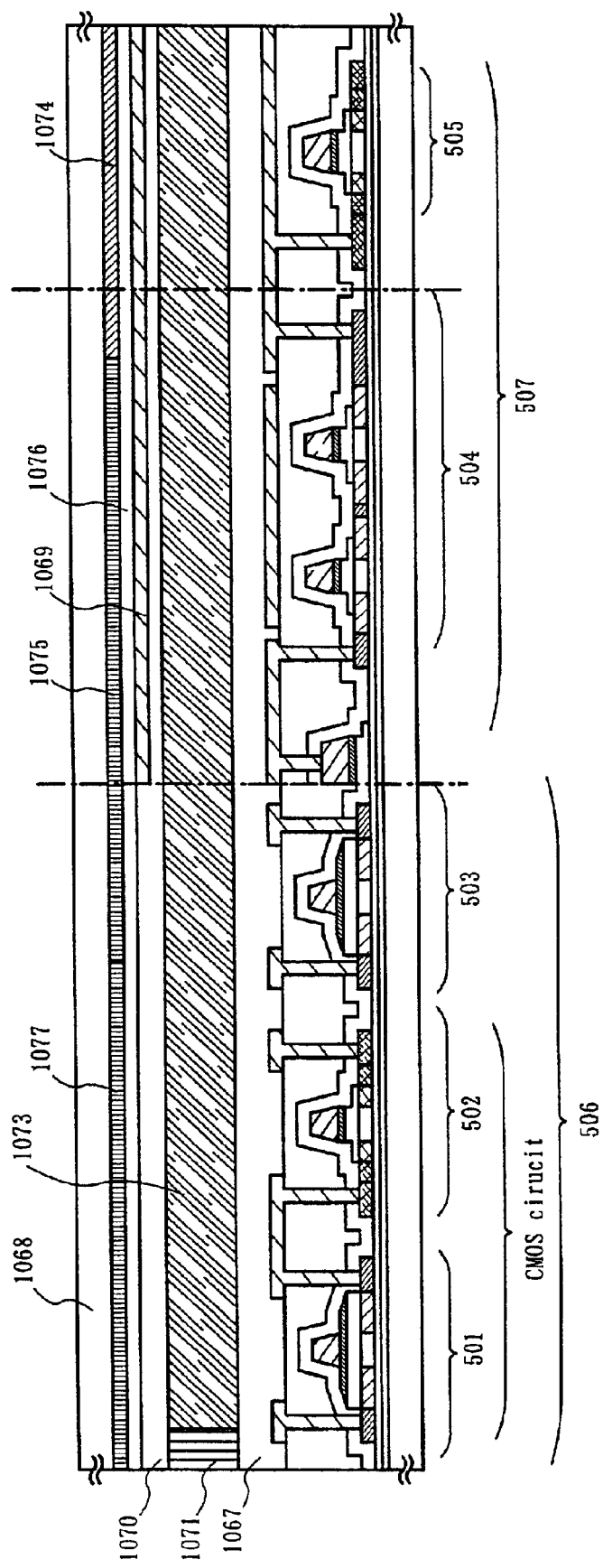
FIG. 10 is a sectional view showing the manufacturing process of an active-matrix liquid-crystal display device.

This embodiment explains, below, a process to manufacture, from the active-matrix substrate made in Embodiment 5, an active-matrix liquid crystal display device different from that of Embodiment 6, using FIG. 10.

First, after obtaining an active-matrix substrate in the state of FIG. 7 according to Embodiment 5, an orientation film 1067 is formed on the active-matrix substrate of FIG. 7 and subjected to a rubbing process. Incidentally, in this embodiment, prior to forming an orientation film 1067, an organic resin film such as an acryl resin film is patterned to form columnar spacers 572 in a desired position to support the substrates with a spacing. Meanwhile, spherical spacers, in place of the columnar spacers, may be distributed over the entire surface of the substrate.

Then, a counter substrate 1068 is prepared. This counter substrate 1068 is provided with a color filter having a coloring layer 1074 and shade layer 1075 arranged correspondingly to the pixels. Meanwhile, a shade layer 1077 is provided also in an area of the drive circuit. A planarizing film 1076 is provided covering the color filter and shade layer 1077. Then, a counter electrode 1069 of a transparent conductor film is formed in the pixel region on the planarizing film 1076. An orientation film 1070 is formed over the entire surface of the counter substrate 1068 and subjected to a rubbing process.

Then, the active-matrix substrate formed with the pixel region and drive circuit and the counter substrate are bonded together by a seal member 1071. The seal member 1071 is mixed with a filler so that the filler and the columnar spacers bond together the two substrates through an even spacing. Thereafter, a liquid crystal material 1073 is poured between the substrates, and completely sealed by a sealant (not shown). The liquid crystal material 1073 may be a known liquid crystal material. In this manner, completed is an active-matrix liquid crystal display device shown in FIG. 10. If necessary, the active matrix substrate or counter substrate is divided into a desired shape. Furthermore, a polarizing plate and the like are properly provided by using a known technique. Then, an FPC is bonded by a known technique.

The liquid crystal display panel manufactured as above can be used as a display part for an electronic appliance in various kinds.

Incidentally, this embodiment can be freely combined with Embodiments 1 to 4.

Embodiment 8

This embodiment explains an example of a light emitting device manufactured by using the invention. In the description, the light emitting device refers, generally, to the display panel having light emitting elements formed on a substrate sealed between the substrate and a cover member, and the display module having an IC mounted on the display panel. Incidentally, the light emitting element has a layer including an organic compound that electroluminescence caused is obtained by applying an electric field (light-emitting layer), an anode and a cathode. Meanwhile, the electroluminescence in organic compound includes the light emission (fluorescent light) upon returning from the singlet excited state to the ground state and the light emission (phosphorous light) upon returning from the triplet excited state to the ground state, including any or both of light emission.

Incidentally, in the description, every layer in a light-emitting element formed between the anode and the cathode is defined as an organic light-emitting layer. The organic light-emitting layer, concretely, includes a light-emitting layer, a hole injecting layer, an electron injecting layer, a hole transporting layer, an electron transporting layer and the like. Basically, the light-emitting element has a structure having an anode layer, a light-emitting layer and a cathode layer laminated in the order. In addition to this structure, there may be structures laminated, in order, with an anode layer, a hole injecting layer, a light-emitting layer and a cathode layer, or with an anode layer, a hole injecting layer, a light-emitting layer, an electron transporting layer, a cathode layer and the like.

Figure 11:
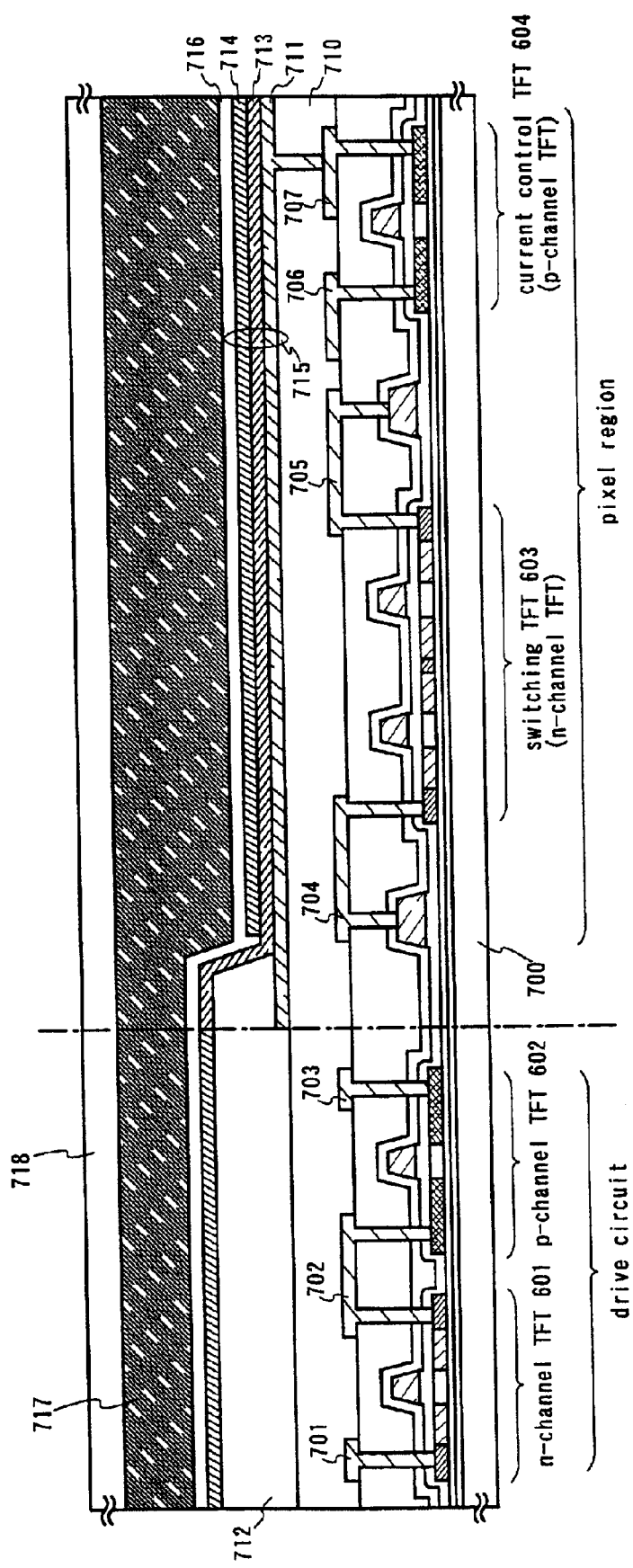
FIG. 11 is a sectional structural view of a drive circuit and pixel region of a light-emitting device.

FIG. 11 is a sectional view of a light emitting device of this embodiment. In FIG. 11, the switching TFT 603 provided on the substrate 700 is formed by using the n-channel TFT of FIG. 11. Consequently, concerning the explanation of the structure, it is satisfactory to refer the explanation on the TFT 503.

Incidentally, although this embodiment is of a double gate structure formed with two channel regions, it is possible to use a single gate structure formed with one channel region or a triple gate structure formed with three.

The drive circuit provided on the substrate 700 is formed by using the CMOS circuit of FIG. 11. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the interconnections 701, 703 serve as source interconnections of the CMOS circuit while the interconnection 702 as a drain interconnection. Meanwhile, an interconnection 704 serves as an interconnection to electrically connect between the source interconnection 708 and the source region of the switching TFT while the interconnection 705 serves as an interconnection to electrically connect between the drain interconnection 709 and the drain region of the switching TFT.

Incidentally, a current control TFT 604 is formed by using the p-channel TFT 502 of FIG. 7. Consequently, concerning the explanation of the structure, it is satisfactory to refer to the explanation on the n-channel TFT 502. Incidentally, although this embodiment is of a single gate structure, it is possible to use a double gate structure or a triple gate structure.

Meanwhile, the interconnection 706 is a source interconnection of the current control TFT (corresponding to a current supply line) while the interconnection 707 is an electrode to be electrically connected to the pixel electrode 710 by being overlaid a pixel electrode 710 of the current control TFT.

Meanwhile, 711 is a pixel electrode (anode of a light-emitting element) formed by a transparent conductor film. As the transparent conductor film can be used a compound of indium oxide and tin oxide, a compound of indium oxide and zinc oxide, zinc oxide, tin oxide or indium oxide, or otherwise may be used a transparent conductor film as above added with gallium. The pixel electrode 711 is formed on a planar interlayer insulating film 710 prior to forming the interconnections. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the interconnection 701–707, a bank 712 is formed as shown in FIG. 11. The bank 712 may be formed by patterning an insulating film or organic resin film containing silicon having 100–400 nm.

Incidentally, because the bank 712 is an insulating film, caution must be paid to device electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1\times10^6$–$10^{12}$ $\Omega$m (preferably $1\times10^8$–$10^{10}$ $\Omega$m).

A light-emitting layer 713 is formed on the pixel electrode 711. Incidentally, although FIG. 11 shows only one pixel, this embodiment separately forms light-emitting layers correspondingly to the respective colors of R (red), G (green) and B (blue). Meanwhile, in this embodiment is formed a small-molecule-based organic electroluminescent material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a light-emitting layer and not necessarily limited to this. It is satisfactory to form a light-emitting layer (layer for light emission and carrier movement therefor) by freely combining a light-emitting layer, a charge transporting layer and an electron injecting layer. For example, although in this embodiment was shown the example in which a small-molecule-based organic electroluminescent material is used for a light-emitting layer, it is possible to use a middle-molecule-based organic electroluminescent material or a polymer-based organic electroluminescent material. Incidentally, in the description, the organic electroluminescent material having no sublimability but the number of molecules of 20 or less or a chained molecular length of 10 $\mu$m or smaller is considered as a middle-molecule-based organic electroluminescent material. Meanwhile, as an example using a polymer-based organic electroluminescent material, a polythiophene (PEDOT) film having 20 nm may be provided as a hole injecting layer by a spin coat technique and a paraphenylene vinylene (PPV) film having approximately 100 nm be provided thereon as a light-emitting layer, to form a lamination structure. Incidentally, if a π conjugated system macromolecule of PPV is used, emission wavelength can be selected from red to blue. Meanwhile, it is possible to use an inorganic material such as silicon carbide for an electron transporting layer or charge injecting layer. These organic electroluminescent materials or inorganic materials can be a known material.

Next, a cathode 714 of a conductor film is provided on the light-emitting layer 713. In the case of this embodiment, as the conductor film is used an alloy film of aluminum and lithium. A known MgAg film (alloy film of magnesium and silver) may be used. As the cathode material may be used a conductor film of an element belonging to the periodic-table group 1 or 2, or a conductor film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light-emitting layer 713 low in heat resistance. Meanwhile, the DLC film, having a high blocking effect to oxygen, can suppress the light-emitting layer 713 from oxidizing. Consequently, prevented is the problem of oxidation in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 11. Incidentally, it is effective to continuously carry out, without release to the air, the process to form a passivation film 716 after forming a bank 712 by using a deposition apparatus of a multi-chamber scheme (or in-line scheme). Also, with further development it is possible to continuously carry out the process up to bonding a cover member 718, without release to the air.

In this manner, n-channel TFTs 601, 602, a switching TFT (n-channel TFT) 603 and a current control TFT (n-channel TFT) 604 on the insulating member 501 based on a plastic substrate. The number of masks required in the manufacture process so far is less than that of a general active-matrix light-emitting apparatus.

Namely, because the TFT manufacture process is greatly simplified, it is possible to realize yield improvement and manufacture cost reduction.

Furthermore, as was explained using FIG. 11, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this embodiment shows only the configuration of the pixel region and drive circuit. However, according to the manufacturing process in the embodiment, besides these, it is possible to form on the same insulating member such logic circuits as a signal division circuit, a D/A converter, an operation amplifier, a γ-correction circuit or the like. Furthermore, a memory or microprocessor can be formed.

Furthermore, explained is a light-emitting device of the embodiment having done the process up to sealing (or encapsulation) for protecting the light-emitting elements, using FIG. 12. Incidentally, the reference numerals used in FIG. 11 are cited as required.

Figure 12A:
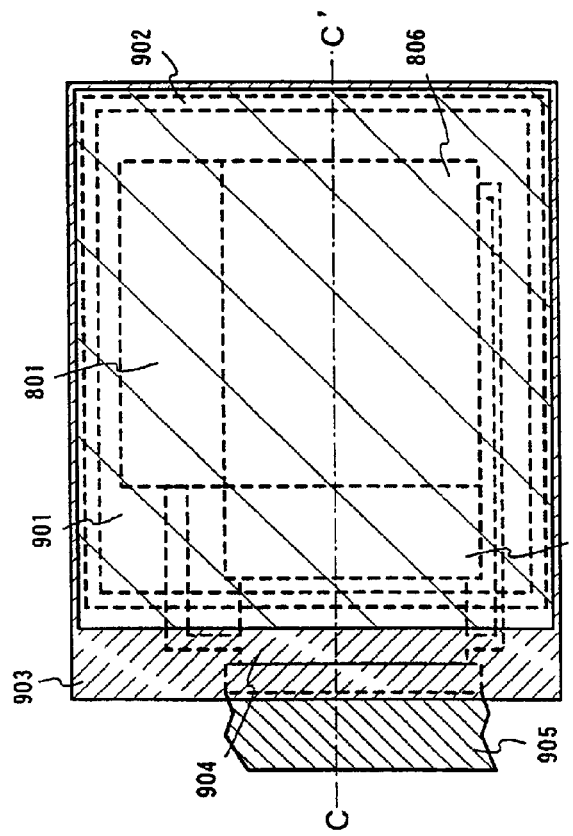
FIG. 12A is a top view of a light-emitting device and FIG. 12B is a sectional structural view of a drive circuit and pixel region of a light-emitting device.
Figure 12B:
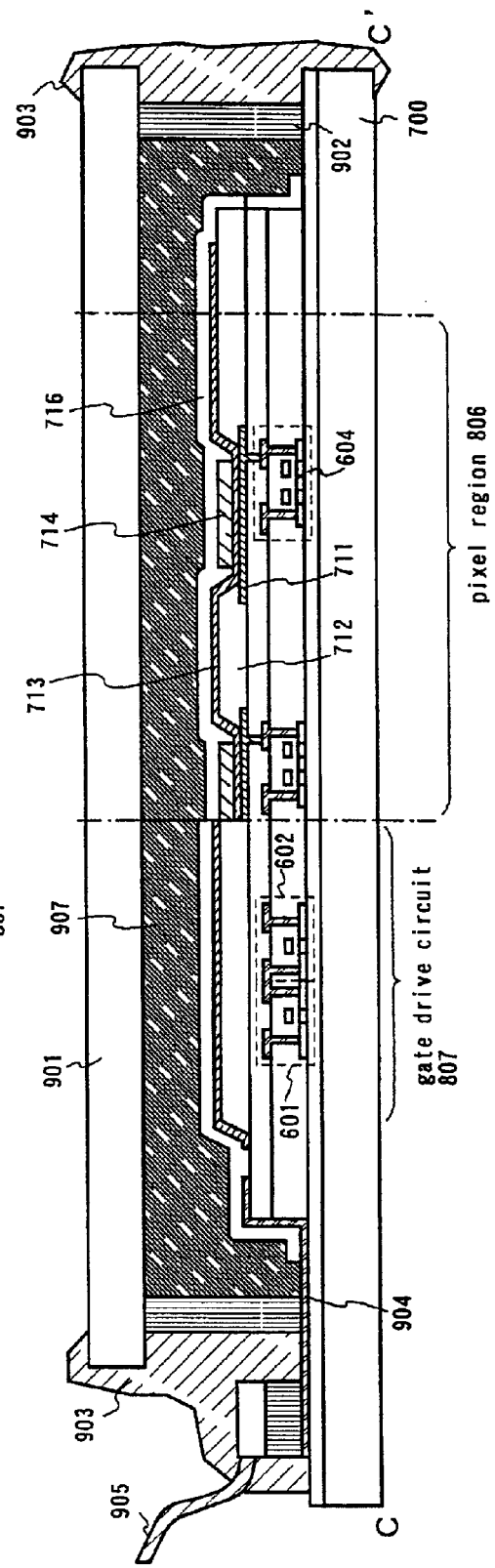

FIG. 12A is a top view showing a state done up to sealing of the light-emitting elements while FIG. 12B is a sectional view taken on line C–C' in FIG. 12A. 801 designated by the dotted line is a source drive circuit, 806 a pixel region and 807 a gate drive circuit. Also, 901 is a cover member, 902 a first seal member and 903 a second seal member. An encapsulation material 907 is provided at the inside surrounded by the seal member 902.

Incidentally, 904 is an interconnection to transmit a signal to be inputted to a source drive circuit 801 and gate drive circuit 807, to receive a video signal or clock signal from an FPC (Flexible Print Circuit) 905 as an external input terminal. Incidentally, although only FPC is shown herein, the FPC may be attached with a printed wiring board (PWB). The light-emitting device in the description includes not only a light-emitting device main body but also such a device in the state attached with an FPC or PWB.

Next, explanation is made on the sectional structure, by using FIG. 12B. The pixel region 806 and the gate drive circuit 807 are formed on the substrate 700. The pixel region 806 is formed with a plurality of pixels each including a current control TFT 604 and a pixel electrode 711 electrically connected to a drain thereof. Meanwhile, the gate drive circuit 807 is formed using a CMOS circuit having a combination of an n-channel TFT 601 and a p-channel TFT 602 (see FIG. 11).

The pixel electrode 711 serves as an anode of a light-emitting element. Meanwhile, banks 712 are formed on the both ends of the pixel electrode 711. On the pixel electrode 711, a light-emitting layer 713 and a cathode 714 of a light-emitting element are formed.

The cathode 714 serves also as an interconnection common to all the pixels and electrically connected to the FPC 905 by way of an connection wiring 904. Furthermore, all the elements included in the pixel region 806 and gate drive circuit 807 are covered by the cathode 714 and passivation film 716.

Meanwhile, a cover member 901 is bonded by the first seal member 902. Incidentally, a resin-film spacer may be provided in order to secure a spacing between the cover member 901 and the light-emitting elements. An encapsulation material 907 is filled inside the first seal member 902. Incidentally, the first seal member 902 and encapsulation material 907 preferably uses epoxy resin. Meanwhile, the first seal member 902 is preferably of a material to transmit water and oxygen to a possible less extent. Furthermore, the encapsulation material 907 may contain a substance having a hygroscopic effect or an antioxidant effect.

The encapsulation material 907 covering the light-emitting elements serves also as an adhesive to bond the cover member 901. Meanwhile, in this embodiment, as a material for the plastic substrate forming the cover member 901 can be used, FRP (Fiberglass-Reinforced Plastics), PVF (polyvinyl Fluoride), Myler, polyester or acryl.

Meanwhile, after bonding the cover member 901 by using an encapsulation material 907, a second seal member 903 is provided so as to cover the side surface (exposed surface) of the encapsulation material 907. For the second seal member 903 can be used the same material as the first seal member 902.

With the above structure, by encapsulating the light-emitting elements in the encapsulation material 907, the light-emitting elements can be completely shielded from the outside. It is possible to prevent the intrusion, from the external, of the substance, such as water or oxygen, which accelerates the deterioration in the light-emitting layer. Thus, a reliable light-emitting device can be obtained.

Incidentally, this embodiment can be freely combined with Embodiments 1 to 6.

Embodiment 9

Figure 13:
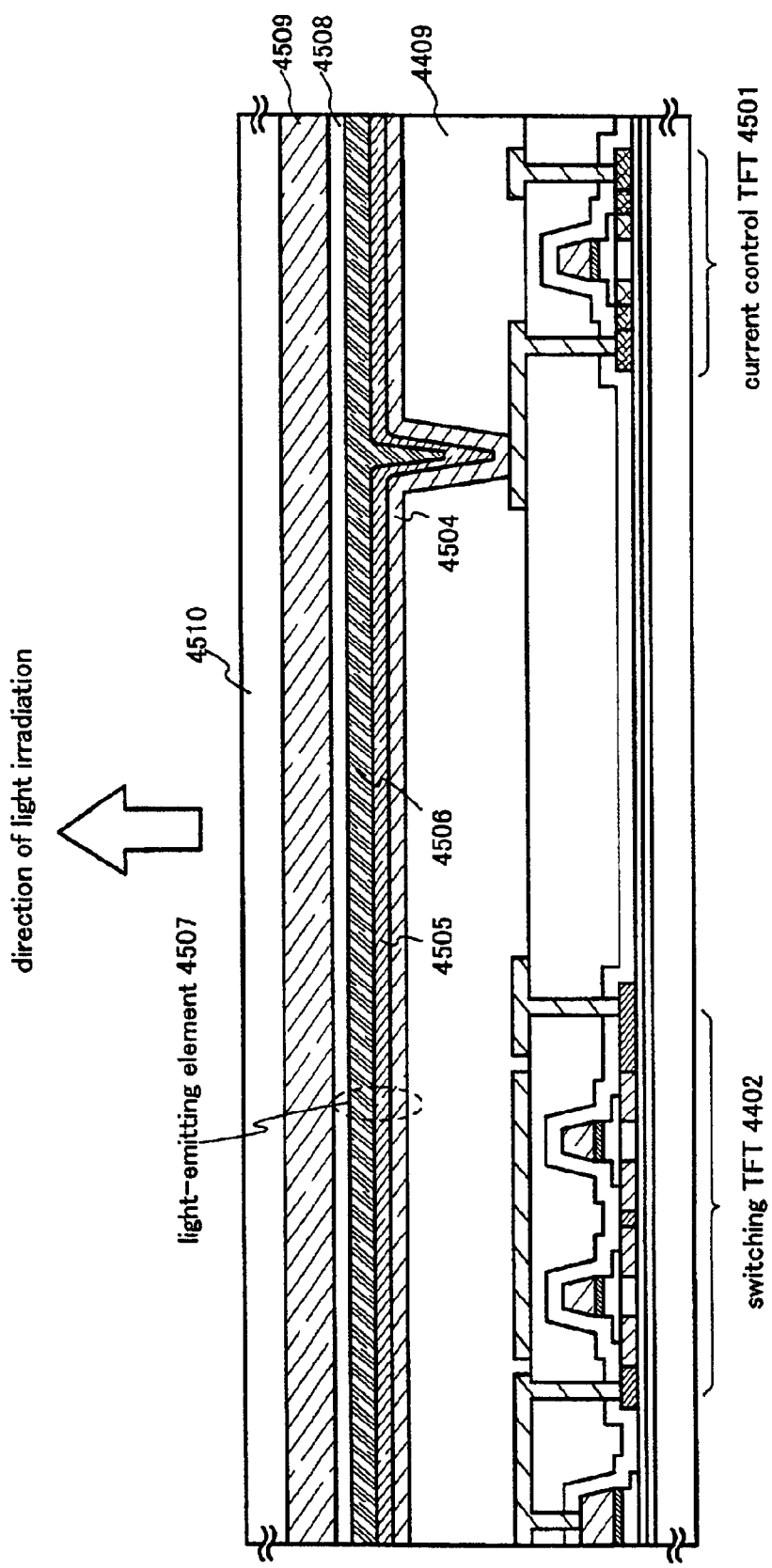
FIG. 13 is a sectional structural view of a pixel region of a light-emitting device.

This embodiment explains a light-emitting device having a pixel structure different from Embodiment 8, using FIG. 13.

In FIG. 13, the current control TFT 4501 is a TFT having the same structure as the n-channel TFT 504 of FIG. 7. The gate electrode of the current control TFT 4501 is electrically connected to a drain interconnection of a switching TFT 4402. Meanwhile, the drain interconnection of the current control TFT 4501 is electrically connected to a pixel electrode 4504.

In this embodiment, the pixel electrode 4504 of a conductor film serves as a cathode of the light-emitting element. Specifically, although an alloy film of aluminum and lithium is used, it is satisfactory to use a conductor film of an element belonging to the periodic-table group 1 or 2 or a conductor film added with such an element.

A light-emitting layer 4505 is formed on the pixel electrode 4504. Incidentally, although only one pixel is shown in FIG. 13, in this embodiment formed is a light-emitting layer corresponding to G (green) by the deposition technique and applying technique (preferably spin coating technique). Specifically, a lithium fluoride (LiF) film having a thickness 20 nm is provided as an electron injecting layer and a PPV (polyparaphenylene vinylene) film having a thickness of 70 nm is provided thereon as a light-emitting layer, thereby forming a lamination structure.

Next, an anode 4506 of a transparent conductor film is provided on the light-emitting layer 4505. In this embodiment, the transparent conductor film is a conductor film of a compound of indium oxide and tin oxide or a compound of indium oxide and zinc oxide.

At the time point of forming up to the anode 4506, a light-emitting element 4507 is completed. Incidentally, the light-emitting element 4507 herein refers to a diode formed with a pixel electrode (cathode) 4504, a light-emitting layer 4505 and an anode 4506.

It is effective to provide a passivation film 4508 in such a manner to completely cover the light-emitting element 4507. The passivation film 4508 is formed of an insulating film including a carbon film, silicon nitride film or silicon nitride oxide film, and used is an insulating layer in a single layer or a combined lamination.

Furthermore, an encapsulation material 4509 is provided on the passivation film 4508 to bond the cover member 4510 thereon. For the encapsulation material 4509 may be used an ultraviolet-ray-set resin. It is effective to provide therein a substance having a hygroscopic effect or an antioxidant effect. Meanwhile, in this embodiment, for the cover member 4510 used is a glass substrate, quartz substrate or plastic substrate (including a plastic film) having carbon films (preferably diamond-like carbon films) formed on the both surfaces thereof.

Incidentally, this embodiment can be freely combined with Embodiments 1 to 6.

Embodiment 10

The CMOS circuit and the pixel portion formed by implementing the present invention can be used in various electro optical devices (active matrix type liquid crystal display, active matrix type EC display and active matrix type light emitting display). That is, the present invention can be implemented in all of electronic apparatus integrated with the electro optical devices at display portions thereof.

As such electronic apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 14, 15 and 16.

Figure 14A:
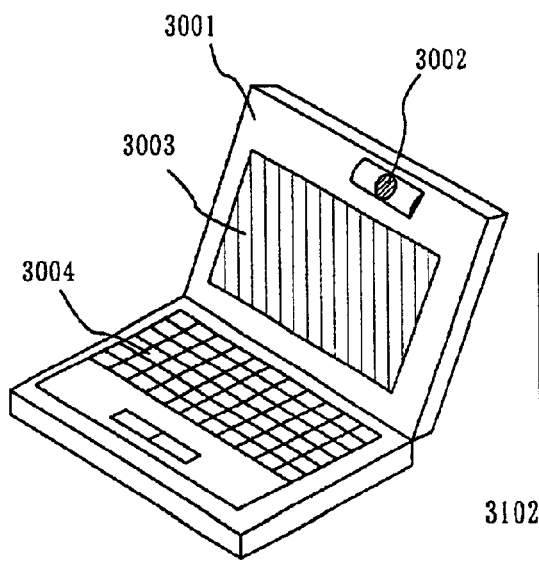
FIGS. 14A to 14F show examples of semiconductor devices.

FIG. 14A shows a personal computer including a main body 3001, an image input portion 3002, a display portion 3003 and a keyboard 3004. The present invention can be applied to the display portion 3002.

Figure 14B:
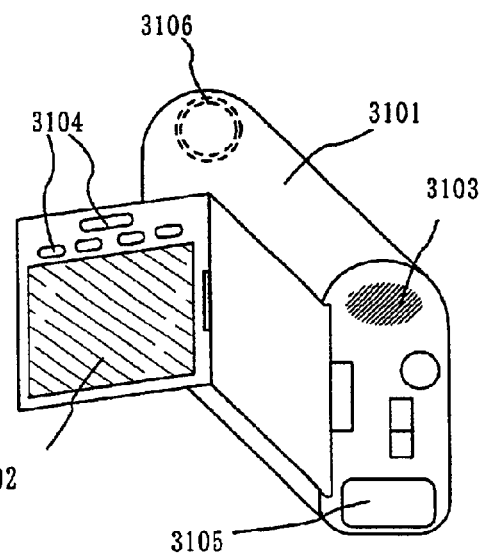

FIG. 14B shows a video camera including a main body 3101, a display portion 3102, a voice input portion 3103, operation switches 3104, a battery 3105 and an image receiving portion 3106. The present invention can be applied to the display portion 3103.

Figure 14C:
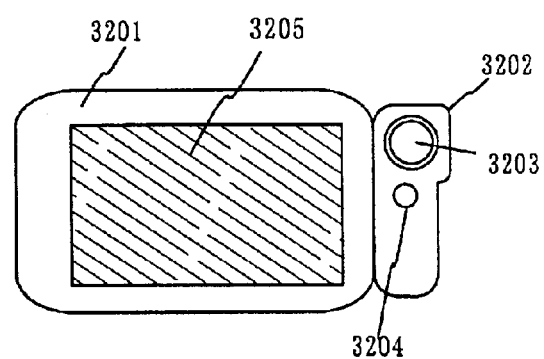

FIG. 14C shows a mobile computer including a main body 3201, a camera portion 3202, an image receiving portion 3203, an operation switch 3204 and a display portion 3205. The present invention can be applied to the display portion 3205.

Figure 14D:
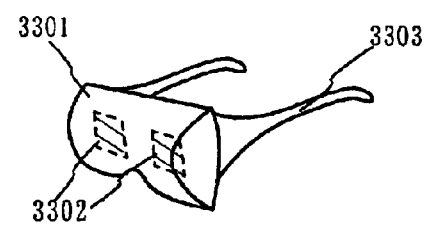

FIG. 14D shows a goggle type display including a main body 3301, a display portion 3302 and an arm portion 3303. The present invention can be applied to the display portion 3302.

Figure 14E:
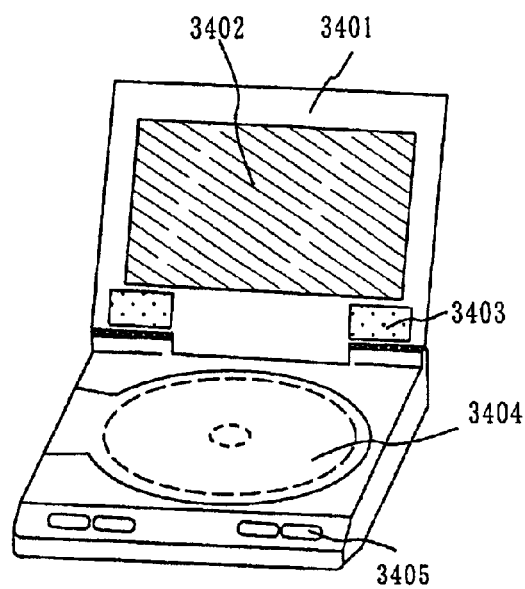

FIG. 14E shows a player using a record medium recorded with programs (hereinafter, referred to as record medium) including a main body 3401, a display portion 3402, a speaker portion 3403, a record medium 3404 and an operation switch 3405. The player uses DVD (digital Versatile Disc) or CD as the record medium and can enjoy music, enjoy movie and carry out game or Internet. The present invention can be applied to the display portion 3402.

Figure 14F:
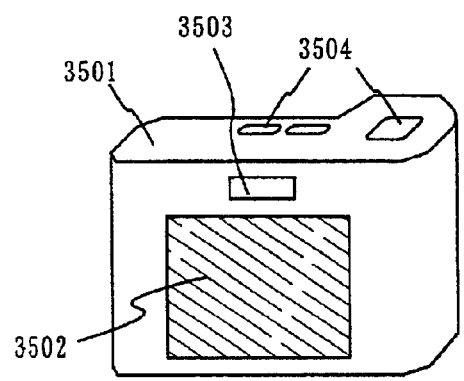

FIG. 14F shows a digital camera including a main body 3501, a display portion 3502, an eye contact portion 3503, operation switches 3504 and an image receiving portion (not illustrated). The present invention can be applied to the display portion 3502.

Figure 15A:
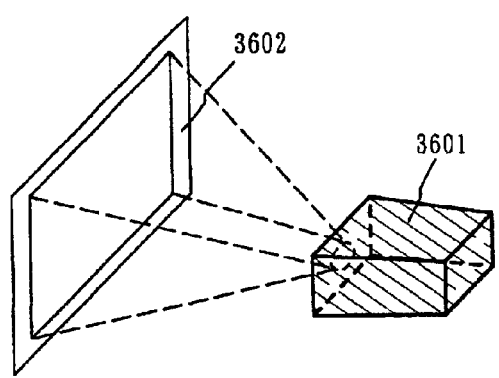
FIGS. 15A to 15D show examples of semiconductor devices.

FIG. 15A shows a front type projector including a projection apparatus 3601 and a screen 3602. The present invention can be applied to the liquid crystal display device 3808 forming a part of the projection apparatus 3601 and other driver circuit.

Figure 15B:
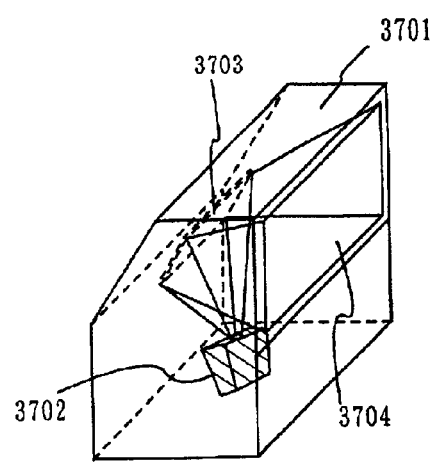

FIG. 15B shows a rear type projector including a main body 3701, a projection apparatus 3702, a mirror 3703 and a screen 3704. The present invention can be applied to the liquid crystal display device 3808 forming a part of the projection apparatus 3702 and other driver circuit.

Figure 15C:
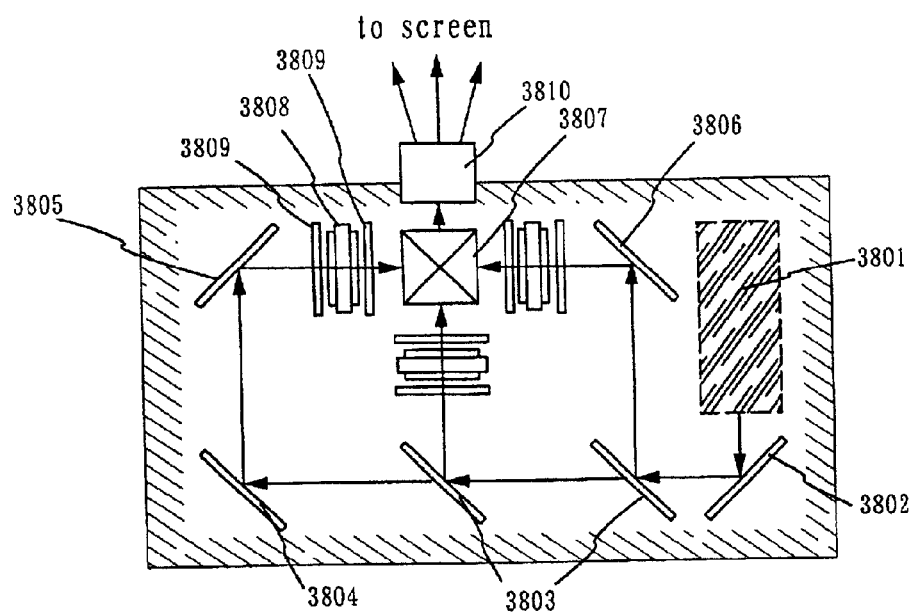

Further, FIG. 15C is a view showing an example of a structure of the projection apparatus 3601 and 3702 in FIG. 15A and FIG. 15B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 15C.

Figure 15D:
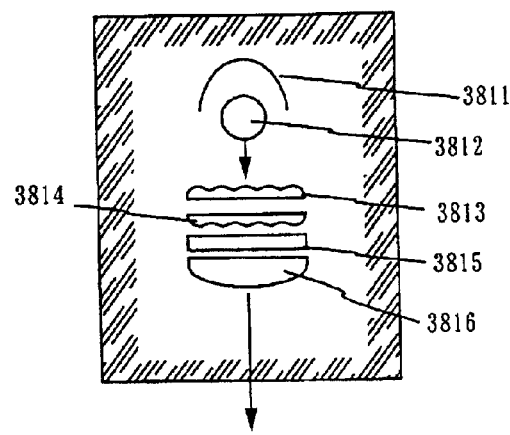

Further, FIG. 15D is a view showing an example of a structure of the light source optical system 3801 in FIG. 15C. According to the embodiment, the light source optical system 3801 is constituted by a reflector 3811, alight source 3812, lens arrays 3813 and 3814, a polarization conversion element 3815 and a focusing lens 3816. Further, the light source optical system shown in FIG. 15D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 15, there is shown a case of using a transmission type electro optical device and an example of applying a reflection type electro optical device and light emitting device are not illustrated.

Figure 16A:
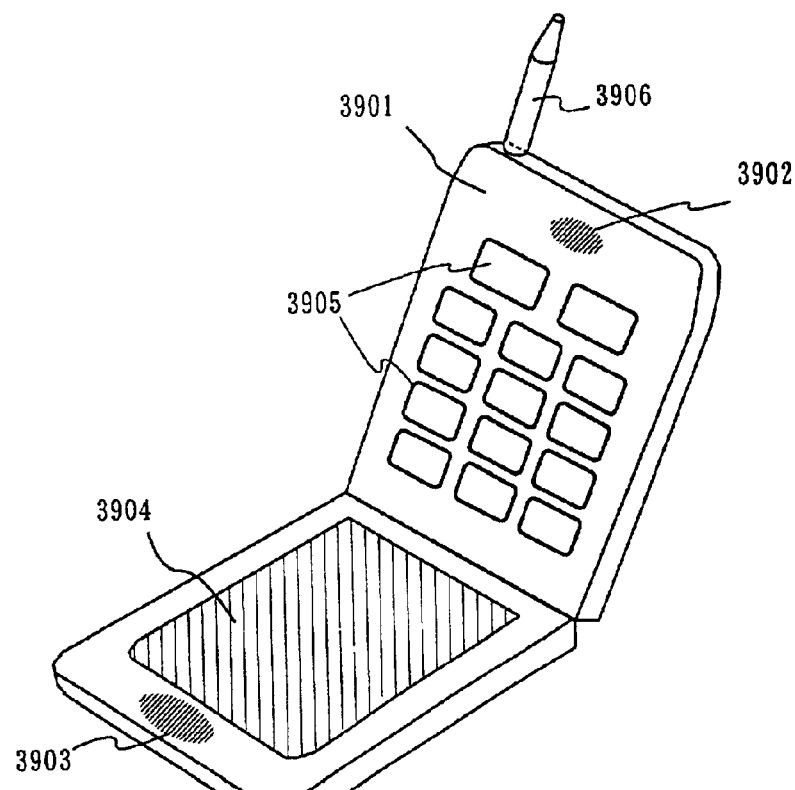
FIGS. 16A to 16C show examples of semiconductor devices.

FIG. 16A shows a portable telephone including a display panel 3901, a sound output portion 3902, a sound input portion 3903, a display portion 3904, an operation switch 3905 and an antenna 3906. The present invention can be applied to display portion 3904.

Figure 16B:
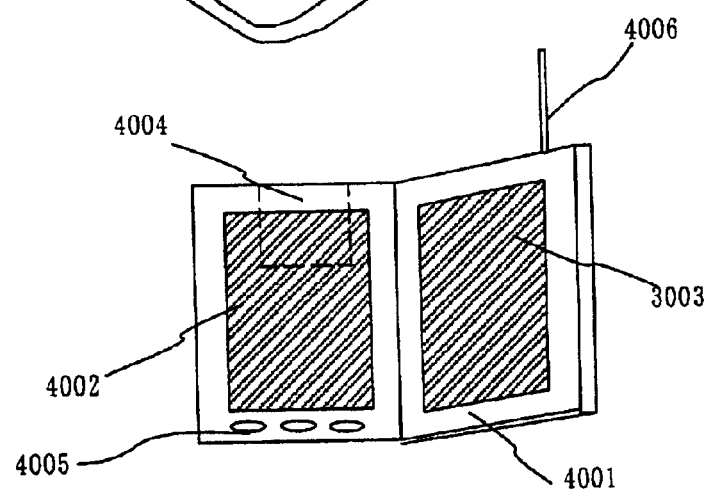

FIG. 16B shows a portable book (electronic book) including a main body 4001, display portion 4002, 4003, a record medium 4004, an operation switch 4005 and an antenna 4006. The present invention can be applied to display portions 4002 and 4003.

Figure 16C:
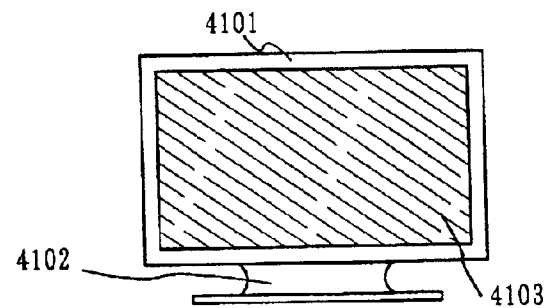

FIG. 16C shows a display including a main body 4101, a support base 4102 and a display portion 4103. The display according to the invention is advantageous particularly in the case of large screen formation and is advantageous in the display having a diagonal length of 10 inch or more (particularly, 30 inch or more).

As has been described, the range of applying the present invention is extremely wide and is applicable to electronic apparatus of all the fields. The electronic apparatus of the present invention can be implemented by freely combined with the structures in Embodiments 1 to 9.

The application of the invention makes it possible to form a TFT having high mobility. Meanwhile, this also makes it possible to manufacture a high-definition active-matrix liquid-crystal display device or a semiconductor device represented by a light-emitting device.

What is claimed is:

1. A method for manufacturing a semiconductor device comprising the steps of:
    irradiating a first intense light to a first semiconductor film to form a second semiconductor film;
    irradiating laser light to the second semiconductor film to form a third semiconductor film having a plurality of convexes; and
    irradiating a second intense light directly to the third semiconductor film to form a fourth semiconductor film.

2. A method for manufacturing a semiconductor device according to claim 1, wherein the first and second intense lights are irradiated from above a substrate on which the first semiconductor film is formed, from below the said substrate or from above and below said substrate.

3. A method for manufacturing a semiconductor device according to claim 1, wherein the first and second intense lights are selected from the group consisting of infrared light, visible light and ultraviolet light.

4. A method for manufacturing a semiconductor device according to claim 1, wherein the first and second intense lights are light emitted from a lamp selected from the group consisting of a halogen lamp, a metal halide lamp, a xenon arc lamp, a carbon arc lamp, a high-pressure sodium lamp or a high-pressure mercury lamp.

5. A method for manufacturing a semiconductor device according to claim 1, wherein an atmosphere within a process chamber when irradiating the first and second intense lights is selected from nitrogen gas and an inert gas.

6. A method for manufacturing a semiconductor device according to claim 1, wherein the laser light is emitted from a laser selected from the group consisting of an excimer laser, a YAG laser, a $YVO_4$ laser, a $YAlO_3$ laser and a YLF laser.

7. A method for manufacturing a semiconductor device comprising the steps of:
    providing a first semiconductor film with a metal for promoting crystallization;
    irradiating a first intense light to the first semiconductor film to form a second semiconductor film;
    irradiating laser light to the second semiconductor film to form a third semiconductor film having a plurality of convexes; and
    irradiating a second intense light directly to the third semiconductor film to form a fourth semiconductor film.

8. A method for manufacturing a semiconductor device according to claim 7, wherein the first and second intense lights are irradiated from above a substrate on which the first semiconductor film is formed, from below said substrate or from above and below said substrate.

9. A method for manufacturing a semiconductor device according to claim 7, wherein the first and second intense lights are selected from the group consisting of infrared light, visible light and ultraviolet light.

10. A method for manufacturing a semiconductor device according to claim 7, wherein the first and second intense lights are emitted from a lamp selected from the group consisting of a halogen lamp, a metal halide lamp, a xenon arc lamp, a carbon arc lamp, a high-pressure sodium lamp and a high-pressure mercury lamp.

11. A method for manufacturing a semiconductor device according to claim 7, wherein an atmosphere within a process chamber when irradiating the first and second intense lights is selected from nitrogen gas and an inert gas.

12. A method for manufacturing a semiconductor device according to claim 7, wherein the laser light is emitted from a laser selected from the group consisting of an excimer laser, a YAG laser, a $YVO_4$ laser, a $YAlO_3$ laser and a YLF laser.

13. A method for manufacturing a semiconductor device according to claim 7, wherein the metal element is one or a plurality of elements selected from Fe, Co, Ni, Ru, Rh, Pd, Os, Ir, Pt, Cu, Ag, Au, Sn and Sb.

14. A method of manufacturing a semiconductor device comprising:
    providing a semiconductor film with a metal for promoting crystallization;

crystallizing said semiconductor film;

irradiating the crystallized semiconductor film with laser light to increase a crystallinity of the crystallized semiconductor film;

irradiating intense light directly to the crystallized semiconductor film after the irradiation of the laser light.

15. A method for manufacturing a semiconductor device according to claim 14, wherein the intense light is irradiated from above a substrate on which the first semiconductor film is formed, from below said substrate or from above and below said substrate.

16. A method for manufacturing a semiconductor device according to claim 14, wherein the intense light is selected from the group consisting of infrared light, visible light and ultraviolet light.

17. A method or manufacturing a semiconductor device according to claim 14, wherein the intense light is emitted from a lamp selected from the group consisting of a halogen lamp, metal halide lamp, a xenon arc lamp, a carbon arc lamp, a high-pressure sodium lamp and a high-pressure mercury lamp.

18. A method for manufacturing a semiconductor device according to claim 14, wherein an atmosphere within a process chamber when irradiating the intense light is selected from nitrogen gas and an inert gas.

19. A method or manufacturing a semiconductor device according to claim 14, wherein the laser light is emitted from a laser selected from the group consisting of an excimer laser, a YAG laser, a $YVO_4$ laser, a $YAlO_3$ laser and a YLF laser.

20. A method for manufacturing a semiconductor device according to claim 7, wherein the metal element is one or a plurality of elements selected from Fe, Co, Ni, Ru, Rh, Pd, Os, Ir, Pt, Cu, Ag, Au, Sn and Sb.

* * * * *